US008890096B2

(12) United States Patent
Li et al.

(10) Patent No.: US 8,890,096 B2
(45) Date of Patent: Nov. 18, 2014

(54) MEASURING/INSPECTING APPARATUS AND MEASURING/INSPECTING METHOD ENABLING BLANKING CONTROL OF ELECTRON BEAM

(71) Applicant: Hitachi High-Technologies Corporation, Tokyo (JP)

(72) Inventors: Wen Li, Chofu (JP); Hisafumi Imura, Yokohama (JP); Hajime Kawano, Hitachinaka (JP); Hiroyuki Takahashi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/935,853

(22) Filed: Jul. 5, 2013

(65) Prior Publication Data
US 2014/0008534 A1  Jan. 9, 2014

(30) Foreign Application Priority Data

Jul. 6, 2012  (JP) .................................. 2012-152310

(51) Int. Cl.
*H01J 37/304* (2006.01)
*B82Y 40/00* (2011.01)
*H01J 37/04* (2006.01)
*H01J 37/26* (2006.01)

(52) U.S. Cl.
CPC ............ *H01J 37/265* (2013.01); *H01J 37/045* (2013.01); *H01J 2237/2485* (2013.01); *H01J 2237/28* (2013.01); *H01J 2237/0432* (2013.01)
USPC ............... 250/492.22; 250/492.1; 250/492.2; 250/492.23; 250/307; 250/310

(58) Field of Classification Search
CPC ........ B82Y 10/00; B82Y 40/00; B82Y 15/00; H01J 37/3174; H01J 37/3177; H01J 37/265; H01J 37/3007; H01J 37/3023; H01J 37/304; G01N 23/255
USPC .................. 250/307, 310, 398, 492.2, 492.3, 250/492.22, 492.23, 492.1, 311, 492.21
See application file for complete search history.

(56) References Cited

U.S. PATENT DOCUMENTS

| | | | | | |
|---|---|---|---|---|---|
| 3,894,271 | A | * | 7/1975 | Pfeiffer et al. | ................ 315/384 |
| 4,633,090 | A | * | 12/1986 | Hahn | ......................... 250/492.2 |
| 4,694,178 | A | * | 9/1987 | Harte | ....................... 250/396 R |
| 4,807,159 | A | * | 2/1989 | Komatsu et al. | ............. 250/311 |

(Continued)

FOREIGN PATENT DOCUMENTS

| | | |
|---|---|---|
| JP | 07-326314 | 12/1995 |
| JP | 2006-013388 | 1/2006 |
| JP | 2006-093251 | 4/2006 |

*Primary Examiner* — David A Vanore
(74) *Attorney, Agent, or Firm* — Antonelli, Terry, Stout & Kraus, LLP.

(57) ABSTRACT

Technique capable of achieving shortening of settling time, which is caused by ringing, etc. of a blanking control signal is provided. A measuring/inspecting apparatus is configured to have a main blanking unit and a correction blanking control unit as a high-speed switching control unit of an electron beam. During the period of switching of a main blanking control signal from ON to OFF, a correction blanking control signal is applied in real time in synchronization with the switching. The ringing caused by the main blanking are corrected so as to be cancelled out by that, the settling time is shortened as a result.

14 Claims, 17 Drawing Sheets

(56) References Cited

U.S. PATENT DOCUMENTS

| | | | |
|---|---|---|---|
| 6,486,479 B1 * | 11/2002 | Oae et al. | 250/492.2 |
| 6,613,482 B1 * | 9/2003 | Yano et al. | 430/5 |
| 6,881,968 B2 * | 4/2005 | Yamada | 250/492.23 |
| 6,911,661 B2 * | 6/2005 | Yabe et al. | 250/492.23 |
| 7,408,155 B2 * | 8/2008 | Oosaki et al. | 250/310 |
| 7,704,645 B2 * | 4/2010 | Mitsui | 430/5 |
| 7,781,748 B2 * | 8/2010 | Platzgummer | 250/492.22 |
| 8,565,509 B2 * | 10/2013 | Takahashi et al. | 382/145 |
| 2001/0052573 A1 * | 12/2001 | Takakuwa | 250/398 |
| 2003/0168616 A1 * | 9/2003 | Yabe et al. | 250/492.3 |
| 2003/0197135 A1 * | 10/2003 | Yamada | 250/492.23 |
| 2005/0214657 A1 * | 9/2005 | Mitsui | 430/5 |
| 2012/0164583 A1 * | 6/2012 | Yamaguchi et al. | 430/296 |
| 2013/0027683 A1 * | 1/2013 | Yamashita | 355/67 |
| 2013/0056645 A1 * | 3/2013 | Yoshikawa et al. | 250/396 R |
| 2013/0175453 A1 * | 7/2013 | Ohishi et al. | 250/396 R |
| 2014/0008534 A1 * | 1/2014 | Li et al. | 250/307 |
| 2014/0065547 A1 * | 3/2014 | Arita | 430/296 |
| 2014/0070112 A1 * | 3/2014 | Ito | 250/397 |

* cited by examiner

FIG. 8

| 270: TABLE | | |
|---|---|---|
| CONDITION 1 | MAIN BLK SETTLING PROFILE 1 | BASIC CORRECTION BLK DATA 1 |
| CONDITION 2 | MAIN BLK SETTLING PROFILE 2 | BASIC CORRECTION BLK DATA 2 |
| ...... | ...... | ...... |
| CONDITION N | MAIN BLK SETTLING PROFILE N | BASIC CORRECTION BLK DATA N | a (D0)  b (D1)  c (D2)

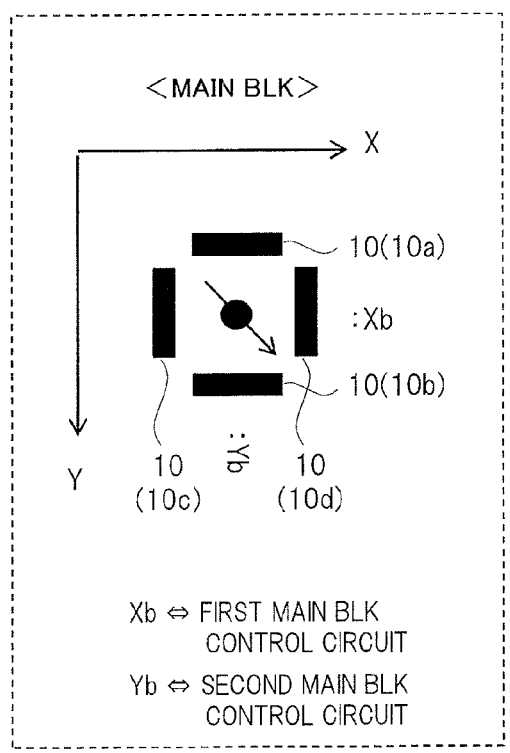
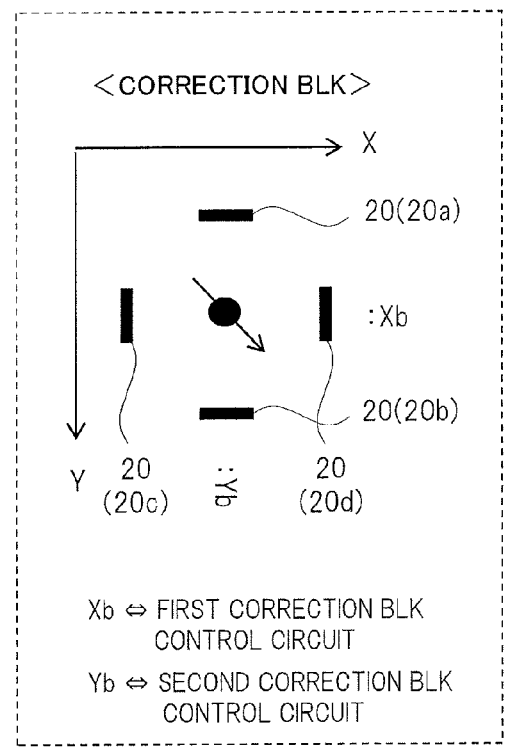
FIG. 10A
FIG. 10B

404: HORIZONTAL LINE (CONTINUOUS IRRADIATION REGION) → ELECTRIFICATION LARGE
405: VERTICAL LINE (NON-CONTINUOUS IRRADIATION REGION) → ELECTRIFICATION SMALL

MEASURING/INSPECTING APPARATUS AND MEASURING/INSPECTING METHOD ENABLING BLANKING CONTROL OF ELECTRON BEAM

CROSS-REFERENCE TO RELATED APPLICATION

The present application claims priority from Japanese Patent Application No. 2012-152310 filed on Jul. 6, 2012, the content of which is hereby incorporated by reference into this application.

TECHNICAL FIELD OF THE INVENTION

The present invention relates to, for example, an apparatus (measuring/inspecting apparatus) that carries out, for example, measuring or inspecting of a sample (target object) such as a semiconductor substrate (wafer) and to a method (measuring/inspecting method) that carries out, for example, measuring or inspecting using the apparatus. The present invention also relates to, for example, an electron microscope apparatus (SEM) of a scanning electron beam system.

BACKGROUND OF THE INVENTION

In semiconductor manufacturing processes, miniaturization of circuit patterns formed on semiconductor substrates (wafers) has been rapidly advancing, and the importance of process monitoring that monitors, for example, whether the patterns are formed following designs or not has been increasing more and more. For example, in order to detect occurrence of troubles and flaws (defects) in the semiconductor manufacturing processes in an early stage or in advance, measuring and inspecting of, for example, circuit patterns on the wafers are carried out at the end of each manufacturing step.

In the above-described measuring/inspecting, in a measuring/inspecting apparatus such as an electron microscope apparatus (SEM) using a scanning electron beam system and in a measuring/inspecting method corresponding thereto, a target wafer (sample) is irradiated with an electron beam (electron ray) while carrying out scanning, and the energy of secondary electrons, etc. generated as a result thereof is detected. Then, based on the detection, an image(s) (measurement image or inspection image) is generated, for example, by signal-processing/image-processing, and measuring and inspecting are carried out based on the image.

For example, in the case of an apparatus (inspecting apparatus, inspecting function) which carries out inspecting of defects in a circuit pattern, images of similar circuit patterns are mutually compared by using the inspection image, and the part at which a difference therebetween is large is determined/detected as a defect. In the case of an apparatus (measuring apparatus, measuring function) which carries out measuring of the circuit pattern, the amount of generation of the secondary electrons, etc. is varied depending on the irregularities (surface profile) of the sample; therefore, variations, etc. in the surface shape of the sample can be captured by an evaluation process of the signals of the secondary electrons. Particularly, when the fact that the signals of secondary electrons are rapidly increased/decreased at an edge part of a circuit pattern is utilized to estimate the position of the edge in the image of the circuit pattern, the dimensional values, etc. of the circuit pattern can be measured. Based on the measurement result thereof, for example whether the processing of the circuit pattern is good or not can be evaluated.

Known technique examples related to the above-described measuring/inspecting include: Japanese Patent Application Laid-Open No. 2006-093251 (Patent Document 1), Japanese Patent Application Laid-Open No. H7-326314 (Patent Document 2), Japanese Patent Application Laid-Open No. 2006-013388 (Patent Document 3), etc.

Patent Document 1 describes, for example, a technique of measuring pattern dimensions at a desired position on a cross-sectional shape of the pattern. Patent Document 1 describes, for example, "a dimension measuring method and an apparatus thereof configured to: acquire a secondary-electron image of a sample by using a scanning electron microscope; create an image profile of a pattern, of which dimensions are to be measured in the acquired secondary-electron image, by using the secondary-electron image; search a model profile that matches the most with the above-described created image profile from a plurality of model profiles, which are stored in advance, are obtained from secondary-electron images of a plurality of patterns having known cross-sectional shapes and dimensions and having mutually different shapes, and are respectively corresponding to the plurality of patterns; and obtain dimensions of the pattern by using the information of the model profile obtained by searching".

Patent Document 2 describes, for example, "as a scanning charged-particle beam apparatus that irradiates an insulator or a semiconductor sample with a primary charged-particle beam and detects a signal obtained from the sample, a scanning charged-particle beam apparatus capable of significantly reducing an electrification phenomenon of the sample is achieved".

Patent Document 3 describes, for example, correction of a transmission line from a blanking control circuit to blanking control electrodes in relation to blanking control (described later).

SUMMARY OF THE INVENTION

In the measuring/inspecting apparatus such as an electron microscope apparatus (SEM) using the above-described scanning electron beam system and in a corresponding measuring/inspecting method, there is a problem that precise measuring/inspecting cannot be carried out (precision is lowered) due to the influence of positive/negative electrification of the sample upon irradiation of an electron beam with respect to the sample. The amount of the electrification depends also on the pattern of the sample, the scanning system, etc. For example, in the raster scanning system, a horizontal-direction (X-direction) line in the pattern is continuously irradiated with a beam; therefore, the amount of electrification is relatively large, and the electrification is for example positive; however, a vertical-direction (Y-direction) line is discontinuously irradiated with a beam, the amount of electrification is therefore relatively small, and the electrification is for example negative (later described FIG. 12, FIG. 14, etc.).

In order to improve the precision of the measuring/inspecting, the unnecessary electrification as described above has to be suppressed. In other words, the unnecessary irradiation time of the beam has to be shortened.

Examples of measures for suppressing the above-described electrification, i.e., shortening of the irradiation time include blanking control that is control of switching ON/OFF of irradiation (shutoff) of a beam (later described FIG. 15, etc.).

However, in known blanking control, upon switching ON/OFF of the irradiation (shutoff); ringing, response delay, etc. are generated in a blanking control signal (voltage), which is applied to blanking control electrodes; and settling time (stabilizing time) serving as the time in which precise measuring/inspecting cannot be carried out is generated (later described in FIGS. 16, 17, etc.). Corresponding to this, in the detected image, distortions corresponding to beam-irradiation (scanning) positional misalignment are generated and form regions in which precise measuring/inspecting cannot be carried out.

In order to improve the precision of the above-described measuring/inspecting, the above-described settling time has to be shortened in order to achieve high-speed scanning control and high-speed blanking control.

Above-described Patent Document 1 does not describe a problem of deterioration in the precision of measuring/inspecting due to the electrification phenomenon of the sample and a measure of solution therefor, etc.

Above-described Patent Document 2 describes, as main measure of solution, neutralization of the electrification phenomenon generated due to irradiation with a primary electron beam by using an auxiliary electron irradiator. However, installing the auxiliary electron irradiator is large burden for the structure and cost of the apparatus. Furthermore, as described in Patent Document 2, the auxiliary electron irradiator also requires control of irradiation of a beam to a sample and shielding thereof by using blanking control. Also in this case, the problem of the settling time occurs; however, measures of solution, etc. therefor are not disclosed.

In above-described Patent Document 3, problems to be solved are reduction in the variations among a plurality of drive circuits and electrodes and misalignment of timing supporting high-speed control. Also in Patent Document 3, a problem (shortening problem) of the settling time required for high-speed scanning (high-speed blanking control) of the beam occurs; however, measures of solution, etc. therefor are not disclosed.

In view of the foregoing, it is a main preferred aim of the present invention to provide techniques capable of achieving shortening of settling time, which is caused by ringing, etc. of a blanking control signal, thereby achieving high precision of measuring/inspecting in order to achieve high-speed scanning and high-speed blanking control in relation to, for example, a semiconductor (sample) measuring/inspecting apparatus and a method of a scanning electron beam system.

In order to achieve the above-described object, a typical aspect of the present invention is, for example, a semiconductor (sample) measuring/inspecting apparatus and measuring/inspecting method of a scanning electron beam system and has a feature in having the following configurations.

An aspect of the present invention is a measuring/inspecting apparatus for carrying out at least one of measuring and inspecting of a sample by a scanning electron beam system, the measuring/inspecting apparatus including: an entirety control unit that controls entirety including the measuring or the inspecting; an interface unit that provides a user interface for an operation including the measuring or the inspecting; an electrooptical system that includes an optical lens for irradiating the sample with an electron beam; an electrooptical control unit that controls the electrooptical system; a deflector for controlling an irradiation position by deflection for scanning control of the electron beam with respect to the sample; a deflection control circuit that generates a control signal and applies the control signal to the deflector; a detector that detects a secondary electron or other energy generated from the sample as a result of irradiation with the electron beam; a signal processing system that processes a signal detected by the detector, generates an image of the measuring or the inspecting, and outputs the image to a user; a storage unit that stores data information about the measuring or the inspecting; a main blanking unit for controlling shutoff of the irradiation of the electron beam with respect to the sample; a correction blanking unit for correction with respect to the main blanking unit; and an aperture for shutting off the electron beam.

The main blanking unit has a main blanking electrode and a main blanking control circuit that generates a main blanking control signal and applies the main blanking control signal to the main blanking electrode; the correction blanking unit has a correction blanking electrode and a correction blanking control circuit that generates a correction blanking control signal and applies the correction blanking control signal to the correction blanking electrode; and in a period of switching of the state of shutoff of the electron beam from ON to OFF by applying the main blanking control signal from the main blanking control circuit to the main blanking electrode, positional misalignment of the irradiation of the electron beam caused by the main blanking control signal is corrected by applying the correction blanking control signal from the correction blanking control circuit to the correction blanking electrode.

According to the typical aspect of the present invention, in relation to, for example, the semiconductor (sample) measuring/inspecting apparatus and a method of the scanning electron beam system, in order to achieve high-speed scanning and high-speed blanking control, shortening of the settling time, which is caused by the ringing, etc. of the blanking control signal, can be achieved, and high precision of measuring/inspecting can be achieved as a result.

BRIEF DESCRIPTIONS OF THE DRAWINGS

FIG. 8 is a diagram illustrating a configuration example of a correlation table;

FIG. 10A is an overhead view illustrating a configuration of blanking electrodes according to a second embodiment;

FIG. 10B is an overhead view illustrating a configuration of blanking electrodes according to the second embodiment;

DESCRIPTIONS OF THE PREFERRED EMBODIMENTS

Hereinafter, embodiments (measuring/inspecting apparatuses and measuring/inspecting methods) of the present invention will be described in detail based on the drawings. In all of the drawings for describing the embodiments, the same parts are basically denoted by the same symbols, and repetitive descriptions thereof will be omitted. Hereinafter, the measuring/inspecting apparatuses (measuring/inspecting methods) include a case in which only a measurement is carried out, a case in which only an inspection is carried out, and a case in which both of the measurement and the inspection can be carried out. Blanking will be optionally abbreviated as BLK.

The measuring/inspecting apparatus of the present embodiment has main blanking unit (main BLK control electrodes 10, a main BLK control circuit 201, etc.) and correction blanking unit (correction BLK control electrodes 20, a correction BLK control circuit 202, etc.) as a unit of high-speed switch control (high-speed scanning, high-speed blanking control) of irradiation (shutoff) of a beam with respect to a sample. With respect to phenomena (and beam irradiation position misalignment caused by that) such as ringing caused in the period of switching of shutoff of beam irradiation from ON state to OFF state by a signal of the main BLK control unit, the present apparatus corrects the ringing, etc. in real time by correction control (application of a correction waveform to the waveform of main BLK) by a signal of the correction BLK control unit. By virtue of this, the settling time is shortened, high-speed control is achieved, and high-precision of measuring/inspecting is achieved. Based on data of the profile of the waveform of the above-described BLK obtained by beforehand measurement, the waveform for the above-described correction BLK (basic correction BLK data) is calculated and obtained. Then, upon actual measuring/inspecting, the waveform of the correction BLK is generated and applied in real time in synchronization with the waveform of the main BLK.

<Conditions>

Before describing the embodiments in detail, technical parts (main BLK control unit of a measuring/inspecting apparatus and a method of a known SEM system) and details of problems etc. regarded as background and premises will be briefly explained below with reference to FIGS. 11 to 17, etc.

(note that these drawings will be also shared by the explanation of the present embodiment).

[Premise (1)]

Figure 12:
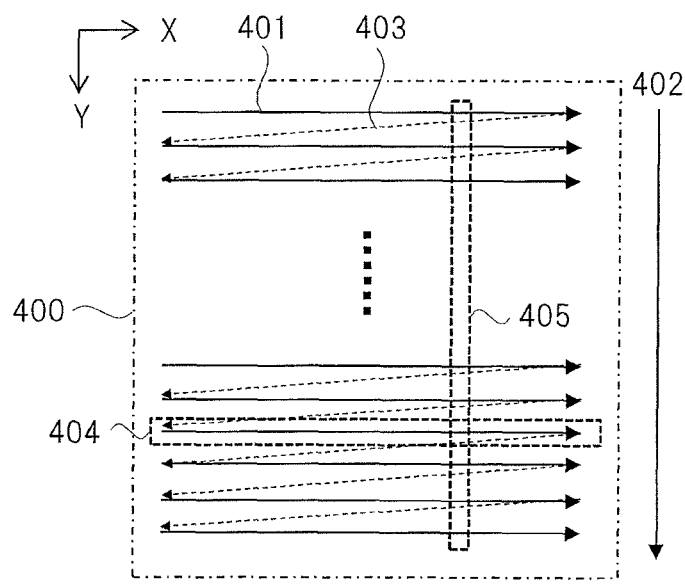
FIG. 12 is a diagram illustrating a raster scanning system of a known case and the present embodiments.

A scanning system of an electron beam of a measuring/inspecting apparatus and method of, for example, the above-described SEM will be described below. For example, normal scanning in CD-SEM (critical dimension SEM) is referred to as TV scanning, raster scanning, etc., and the scanning time thereof per one screen is about 26 µs. The scanning based on the TV scanning and using an n-fold speed thereof is referred to as n-fold-speed scanning, wherein, for example in the case of quad-speed scanning, the scanning time of one screen is about 26/4=6 µs. FIG. 12 illustrates a raster scanning system.

In the above-described system, secondary electrons are emitted from a sample because of mutual actions between a beam (primary electron beam) incoming to the sample and the sample. The number of the emitted electrons per one incoming electron is referred to as a secondary-electron emission rate ($\eta$). "$\eta$" depends on the irradiation energy of the beam and the material, shape, etc. of the sample. If $\eta<1$, negative electrification is obtained since negative charge is accumulated in the sample by the beam irradiation. On the other hand, if $\eta>1$, positive electrification is obtained since positive charge is accumulated in the sample.

For example, scanning is carried out on the above-described sample, which has been negatively electrified, with a primary electron beam, secondary electrons from the sample are detected, and an image thereof (secondary electron image) is obtained. Even in this case, the (negative) electrified part of the sample lights brightly, and observation (measurement or inspection) of the surface state of the sample cannot be carried out or precision thereof becomes low, posing a problem. Even when a secondary electron image is obtained by carrying out scanning on a positively electrified sample with a beam in an opposite manner, the (positive) electrified part(s) of the sample becomes dark, and, similarly, observation cannot be carried out or precision thereof becomes low, posing a problem. Particularly when the sample is an insulator, the above-described phenomena become notable.

The amount of the above-described electrification also depends on the shape (and a scanning system therefor), etc. of the pattern of the sample. For example, when a horizontal line of the pattern is scanned (a case in which an X-direction line is scanned by a raster scanning system) (404 of FIG. 12), the horizontal line is continuously irradiated with a beam, and the amount of accumulated charge therefore becomes large. Therefore, potential increase caused by the electrification is large, the number of the secondary electrons pulled back to the sample is increased, and an image contrast is lowered. On the other hand, in a case in which a vertical line (assumed to have the same length/area as those of the above-described horizontal line) of the same pattern is scanned (the same raster scanning system) (405 of FIG. 12), the scanning is discontinuous and is separated into horizontal-direction (X-direction) parts for a plurality of times, and continuous irradiation time on the vertical line therefore becomes short. Therefore, potential increase caused by the electrification is small, the number of detectable secondary electrons is larger in the case of the vertical line, and an image with a good contrast is obtained.

When the vertical/horizontal lines of the pattern are observed by raster scanning in the above-described manner, the contrast of the horizontal line becomes low as compared with that of the vertical line, and there is a problem that, for example, edges of the line are lost. Thus, there is a problem of precision of the measurement/inspection due to, for example, the influence of the electrification of the sample caused by beam scanning.

In order to solve/improve the above-described problem, the unnecessary electrification as described above has to be suppressed. In other words, the number of the secondary electrons returned to the sample has to be reduced (the amount of electrification has to be reduced) by suppressing the potential increase at the surface of the sample caused by the beam irradiation (continuous irradiation). Therefore, reducing the time of unnecessary irradiation with respect to a sample by a beam is effective.

As a measure that achieves the above-described shortening of the irradiation time, high-speed blanking control is used. In blanking control of a known SEM (FIG. 11), switch control of irradiation/shutoff of a beam with respect to a sample is carried out by using BLK electrodes, a deflector, and an aperture. For example, an irradiation (shutoff OFF) state is normally used, and switching to non-irradiation (shutoff ON) state is temporarily/partially carried out. Particularly, if high-speed/detailed switch control is carried out, unnecessary irradiation time can be correspondingly shortened.

[Promise (2)]

Figure 11:
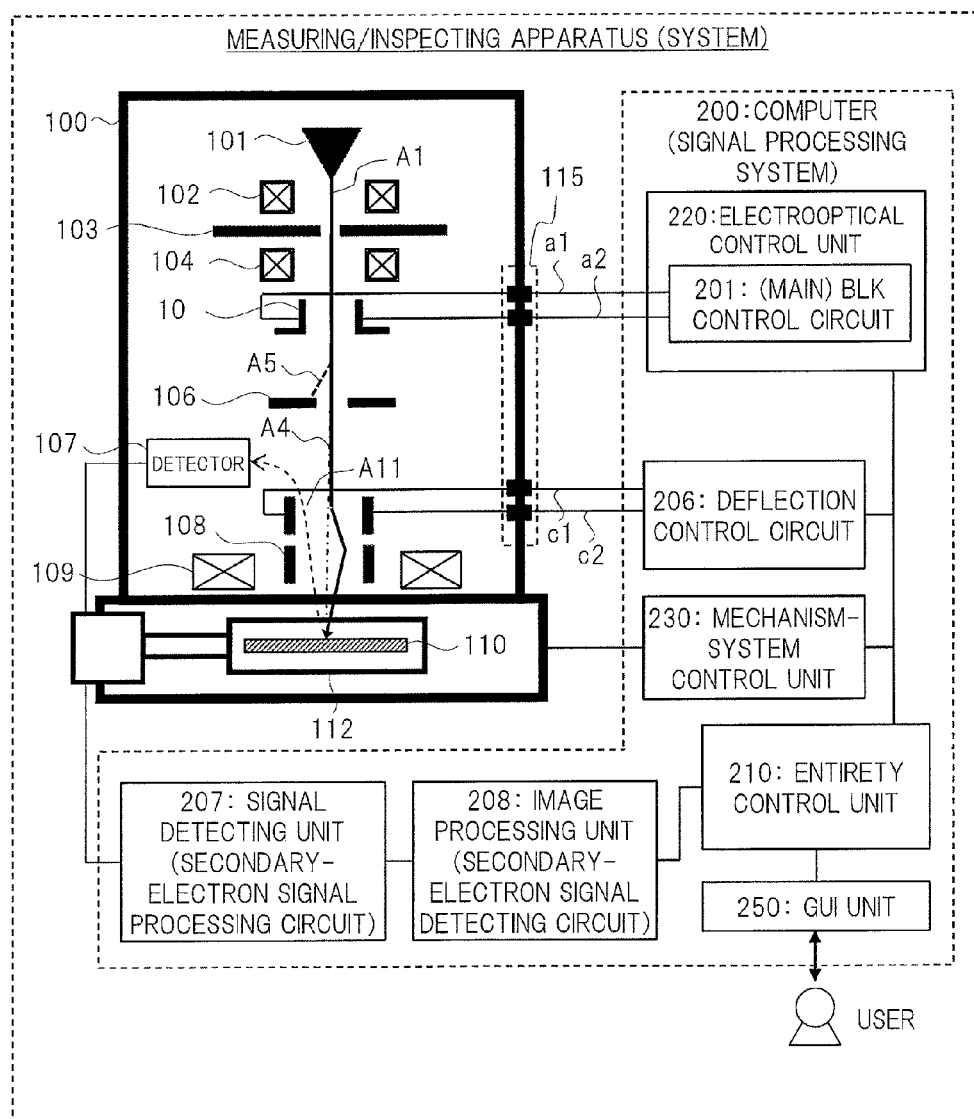
FIG. 11 is a diagram illustrating a configuration of a whole system comprised of a semiconductor measuring/inspecting apparatus of a known scanning electron beam system.

FIG. 11 illustrates an example of a configuration of a known SEM apparatus (system). A main difference from the present embodiment (FIG. 1) is the presence/absence of correction BLK unit (20, 202, etc.). As blanking control unit, the configuration has a BLK control circuit 201, BLK control electrodes 10, etc. Normally, upon irradiation as a result of turning blanking (shutoff) OFF, a sample 110 is irradiated with a beam by the flows of A1 and A4, and secondary electrons A11 generated by that are detected by a detector 107. Upon non-irradiation as a result of turning blanking ON, the beam is shielded by an aperture 106 by the flows of A1 and A5.

In FIG. 11, the configuration is such that secondary electrons A11 generated from the sample 110 are detected by the detector 107. However, the configuration is not limited thereto, and other energy such as transmission electrons or absorption electrons generated from the sample 110 may be detected.

[Promise (3)]

Hereinafter, an example of a raster scanning system of a known scanning electron beam system will be described with reference to FIGS. 12, 14, etc.

FIG. 12 illustrates a raster scanning system. "400" represents a region (overall image) corresponding to a scanning region 301 (beam scanning trajectory 300) on the sample 110 (sample stage 112) of FIG. 14. "401" represents continuous scanning (irradiation) of each line in the X-direction (corresponding to the X-direction of FIG. 14) with a beam. "402" represents continuous movement (feed) of the beam in the sequence of lines in a Y-direction (corresponding to the Y-direction of FIG. 14). "403" represents returning trajectories (non-irradiation/shutoff state) of the beam between the X-direction lines. "404" represents an example of the X-direction line (horizontal line) in a pattern (irradiation target region) (serving as a continuous irradiation region), and "405" represents an example of a Y-direction line (vertical line) (serving as a non-continuous irradiation region).

Upon measuring/inspecting, scanning (irradiation) of each X-direction single line (401) with a beam is started. When it reaches an endpoint of the single line and the scanning of the single line is finished, the beam is returned (403) to an X-direction left start point (top of a next single line) along with movement (402) in the Y-direction, scanning of the next single line is started, and the procedure is repeated.

[Promise (4)]

Figure 14:
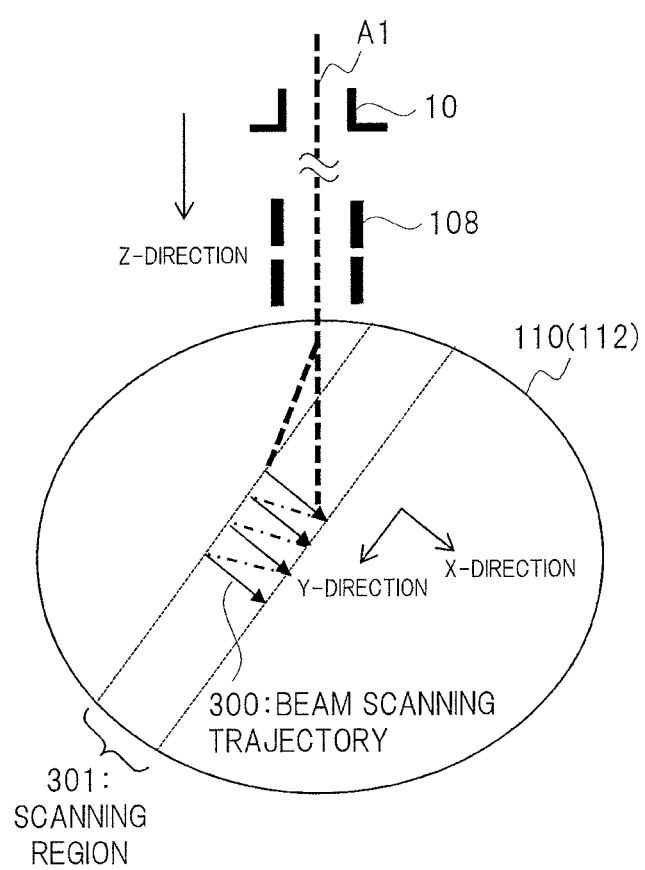
FIG. 14 is a perspective view schematically illustrating the scanning system of the electron beam in the known case and the present embodiments.

FIG. 14 illustrates a measuring/inspecting apparatus (FIG. 11) of the SEM system and the scanning direction, etc., of an electron beam of the raster scanning system (FIG. 12). A Z-direction illustrated in the drawing is the irradiation direction of a beam A1, which is perpendicular to a plane of the sample 110 (or the sample stage 112). As the directions (coordinates) of X and Y, for example, the scanning direction of each line of the beam A1 of the raster scanning system is the X-direction, and the moving direction (feeding direction) of the beam A1 (or the sample stage 112) orthogonal to the X-direction is the Y-direction. The X-direction scanning includes a continuous scanning (irradiation) region, and the Y-direction scanning includes a non-continuous scanning (irradiation) region.

For example, scanning is repeatedly carried out for each X-direction line while continuously moving a beam (or the sample stage 112 on which the sample 110 is placed) in the Y-direction. In order to achieve the repeated scanning, deflection at a deflector 108 is controlled by deflection control signals (c1, c2) from a deflection control circuit 206. In synchronization with the above-described scanning of each X-direction line, the secondary electrons A11 generated from the sample 110 are detected by the detector 107. As a result, a two-dimensional image(s) (measurement image, inspection image) is obtained through a signal detecting unit 207 and an image processing unit 208.

As a configuration example for scanning control of the above-described beam, scanning with the beam is carried out in the sequence of the lines in the X-direction by deflection control, and the sample stage (stage) 112 on which the sample 110 is placed is configured so that the stage can be subjected to continuous movement control in the X-direction and Y-direction by a mechanism-system control unit 230; however, the movement control can be carried out not only by this configuration. For example, a configuration in which the electron beam (irradiation system, etc.) side is subjected to movement control while fixing the sample stage 112 side may be used. Alternatively, the beam may be used in scanning in an optional direction of the X-direction and Y-direction by deflection control while fixing the sample stage 112. Alternatively, a configuration in which the sample stage 112 is physically subjected to rotation control by the mechanism-system control unit 230 so as to be moved continuously only in one direction, i.e., the X-direction or Y-direction may be employed.

[Promise (5)]

Figure 2A:
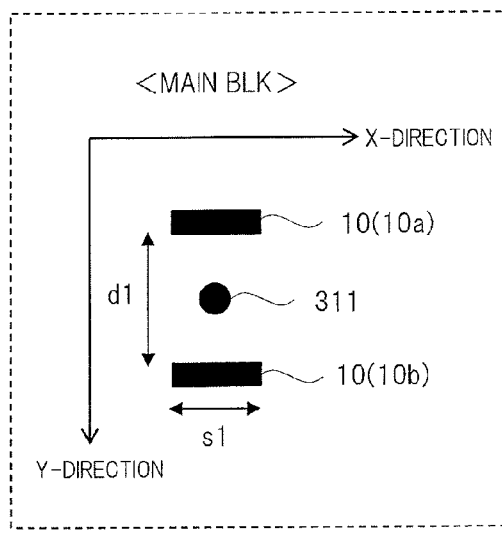
FIG. 2A is an overhead view illustrating a configuration of blanking electrodes according to the first embodiment and a known aspect.
Figure 13:
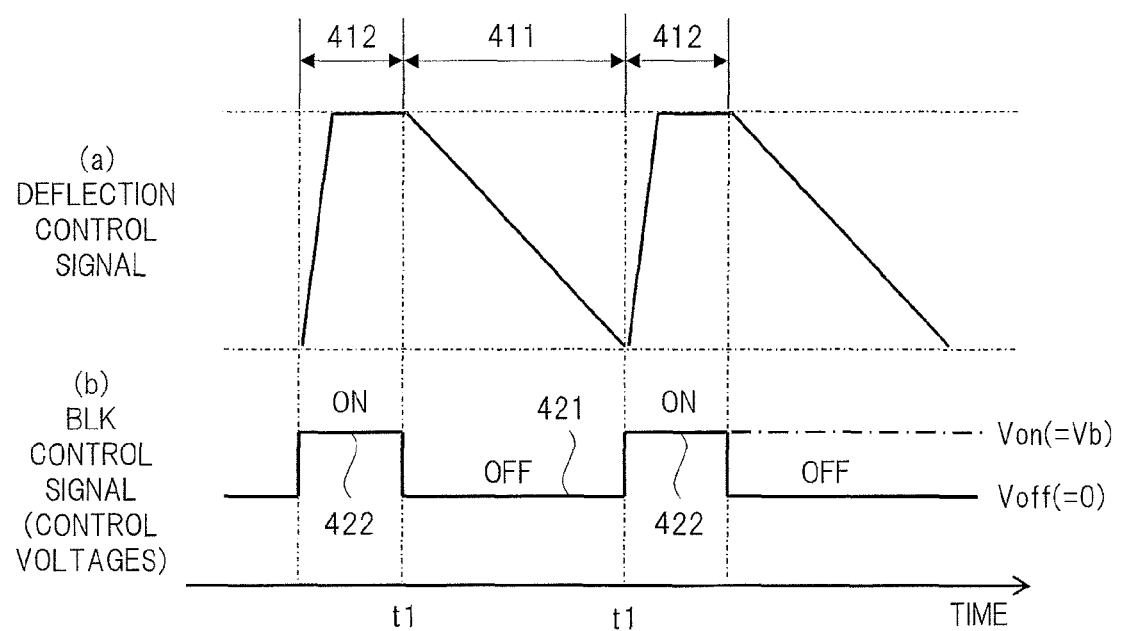
FIG. 13 is a diagram illustrating waveform examples of a deflection control signal and a blanking control signal of a beam in the case of the raster scanning system of FIG. 4A according to the known case and the present embodiments.

FIG. 2A illustrates a configuration example of the BLK control electrodes 10, which are elements for controlling shutoff of the electron beam, so as to correspond to FIG. 14 by an overhead view taken in the plane of the X-direction and Y-direction of FIG. 14. The BLK control electrodes 10 are, in general, configured to be a pair of metal plates (10a, 10b) disposed to be parallel and opposed to each other. An electric field is generated between the electrodes by a voltage difference applied to the BLK electrodes 10 (10a, 10b) according to BLK control signals (waveform of ON/OFF) from the BLK control circuit 201 (FIG. 13). By virtue of this, Coulomb force is generated in the beam at a position (311) which passes through the part between the electrodes, thereby deflecting the beam.

Normally, when the BLK control signal ((b) of FIG. 13) is OFF (421), the electric field (deflecting electric field) between the BLK control electrodes 10 is not generated, and the beam (A4) passes through a hole at the center of the aperture 106 below the ELK control electrodes 10 and irradiates the sample 110. When the BLK control signal is ON (422), an electric field (deflecting electric field) between the BLK control electrodes 10 is generated, and the beam (A5) is deflected, is deviated from the hole of the aperture 106, is shielded, and does not irradiates the sample 110.

The voltage of the BLK control signal applied to the above-described BLK control electrodes 10 is in a range of about several tens to 100 V. In the example illustrated, a predetermined voltage is applied to one (a signal line a1 of the BLK control signal) of the two metal plates (10a, 10b) of the BLK control electrodes 10, and the other one (a ground line a2 of the ELK control signal) is grounded. However, there is also a case in which positive/negative (±) voltages are applied to both of the BLK control electrodes 10.

[Promise (6)]

FIG. 13 illustrates voltage waveforms of (a) the deflection control signal and (b) the BLK control signal corresponding to the scanning of FIG. 12. The waveform (a) illustrates the waveform of the deflection control signal for controlling deflection of the beam so as to obtain the trajectory (region) of 400 of FIG. 12 and corresponds to the deflection control signal (c1, c2) applied from the deflection control circuit 206 to the deflector 108. The waveform (b) illustrates the waveform of the BLK control signal for controlling ON/OFF of shutoff of the beam by BLK control and corresponds to the BLK control signal (a1, a2) applied from the BLK control circuit 201 to the BLK control electrodes 10. In the waveform of (a), "411" is the part of beam deflection control during scanning (irradiation) of each X-direction single line (401) upon acquisition of a measurement image (data). "412" is the part of the beam deflection control of a case when returning to a start point (403) after scanning until an end point of the X-direction single line (401) is finished (returning period). In the waveform of (b), "421" represents the period in which the BLK control signal is OFF (blanking OFF state) in synchronization with 411 of (a), and "422" represents the period in which the BLK control signal is ON (blanking ON state) in synchronization with 412 of (a). Also, t1 represents the point of time of above-described switching from ON to OFF. The voltage during blanking OFF is Voff (for example, 0 [V]), and the voltage during blanking ON is Von (Vb).

Upon returning of the beam like 403 as described above, in order to prevent the sample 110 from being unnecessarily irradiated with the beam, the beam is deflected and shut off by the aperture 106 by turning ON the BLK control signals in the manner of 412 and 422.

Furthermore, when the BLK control signals are suitably switched to ON also on the single line (401), irradiation of the beam is shut off in that part. If this switching of ON/OFF can be achieved at high speed and in details, precision can be improved by eliminating unnecessary irradiation time as much as possible.

[Premise (7)]

A scanning system other than the above-described raster scanning system is also present. For example, some of recent SEMs support a vector scanning system, etc. In the vector scanning system, scanning is controlled in an optional direction in an X-Y plane. For example, the direction of scanning can be controlled along the direction of a pattern shape desired to be measured on a sample, and data of a desired coordinate point (the number of pixels, etc.) can be obtained. In comparison with the above-described raster scanning system (the case in which each of the lines are simply sequentially scanned as illustrated in FIGS. 12 and 14), the case in which the vector scanning system is used is further advantageous particularly for improving the above-described electrification problem. A reason thereof is that the scanning direction of a beam and ON/OFF of irradiation (shutoff) can be controlled in detail with respect to the region (for example, pattern shape) of the sample which is a measuring/inspecting target.

Figure 15:
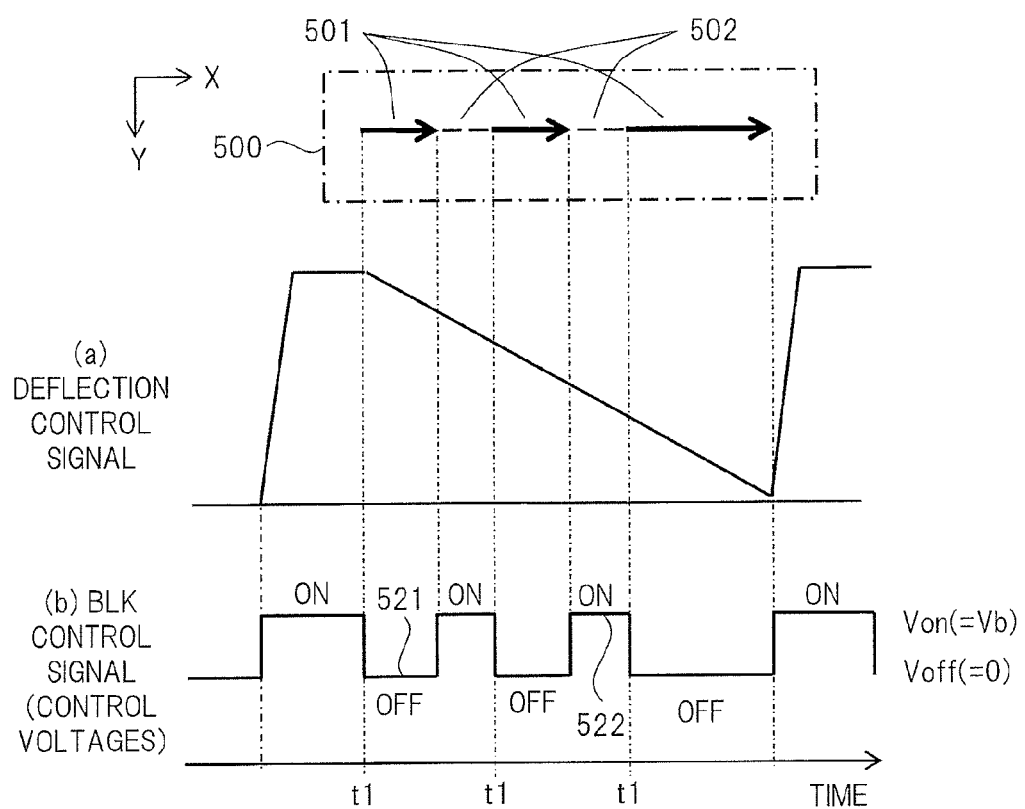
FIG. 15 is a diagram illustrating a beam scanning trajectory and waveform examples of a deflection control signal and a blanking control signal in a case of a vector scanning system in the known case and the present embodiments.

FIG. 15 illustrates an example of the vector scanning system. The system illustrated in FIG. 15 can be also viewed as an explanatory diagram of a system in which blanking ON/OFF is switched in detail during the scanning of each line of the above-described raster scanning system (also referred to as a skipped scanning system). "500" represents trajectories (regions) of scanning (movement) of a beam in the X-Y plane on the sample 110. In this case, the line is illustrated as an X-direction line in the same manner as described above; however, the direction can be set in an optional direction (for example, the direction of 45 degrees in the case in which X is 0 degree) and is variable. In the lines of 500, "501" represents a partial pattern of a measurement target, i.e., target regions (pixel regions) irradiated with the beam. "502" represents non-irradiation regions (shutoff regions) of the beam. If the whole part of the line (500) is irradiated with the beam, excessive electrification is generated; therefore, the line is separated into the regions (501) which require irradiation and the regions (502) which do not require irradiation, only the regions (501) which require irradiation are irradiated, and the beam is configured to be shut off in the regions (502) which do not require irradiation so that the regions are not irradiated.

Corresponding to the above description, the waveform (a) illustrates a deflection control signal in the same manner as described above, and the waveform (b) illustrates a BLK control signal. Switching of ON/OFF of blanking (shutoff) is controlled by (b). In the irradiation regions (501), OFF signals (521) are used; and, in the shutoff regions (502), ON signals (522) are used. "t1" is the point of time of switching from ON (522) to OFF (521).

[Promise (8)]

When measuring or inspecting is to be carried out by irradiating a sample with a beam by a SEM in the above-described manner, if excessive positive/negative electrification is generated in the sample depending on the pattern, the scanning system, etc., accurate measuring/inspecting cannot be carried out. Therefore, unnecessary electrification has to be suppressed and it also means that unnecessary irradiation time has to be shortened. The unit therefor includes blanking control (high-speed blanking control). However, if high-speed blanking control is carried out together with, for example, the rater scanning system or the vector scanning system, there is the following problem.

When returning (entering) from the non-irradiation region to the irradiation region like the above-described beam returning (403), in other words, when a temporary blanking ON state (shutoff state) is switched to an OFF state, the voltage difference of the BLK control signals applied to the BLK control electrodes 10 has to be returned to 0 (zero) it also means that the voltage difference has to be returned from a predetermined voltage value (Von) to a predetermined voltage value (Voff).

Figure 16:
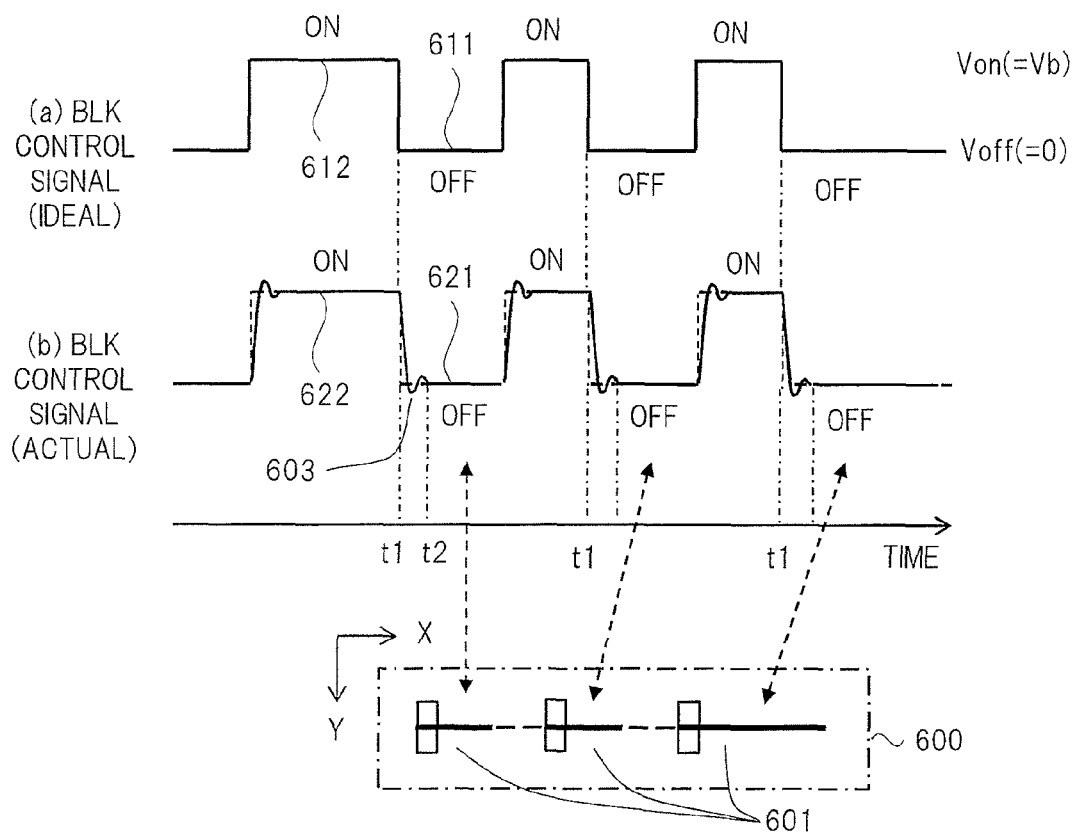
FIG. 16 is a diagram illustrating an example of an ideal waveform and an actual waveform of the blanking control signal in the known case and the present embodiments.

FIG. 16 illustrates an example of an ideal waveform and an actual waveform of the known BLK control signal related to the above description. "600" represents the region of a pattern of the sample 110 serving as a target in the same manner as described above (the case of X-direction line). "601" represents parts of the measurement target. Although the waveform (a) is similar to the waveform (b) of FIG. 15, it is a voltage waveform of an ideal BLK control signal applied to the BLK control electrode 10. "612" represents ON time (Von: Vb), and "611" represents OFF time (Voff: 0). The waveform (b) illustrates an actual waveform corresponding to the waveform (a).

The voltage waveform of the BLK control signal is affected by the characteristics of the BLK control circuit 201, which generates the BLK control signal, and by the characteristics of a transmission line (signal line) from the BLK control circuit 201 to the BLK control electrode 10 installed in a column 100 (vacuum). Due to this influence, the BLK control signal actually applied to the BLK control electrode 10 has the actual waveform as illustrated in (b) instead of the ideal waveform like (a).

In the actual waveform of (b), for example when the voltage of ON/OFF is returned from a high voltage (Von) of the ON time (622) to 0 V (Voff) of the OFF time (621) (time point t1 to t2) by high-speed switching, ringing like 603 (voltage ringing, convergence delay) (transient waveform) is inevitably generated.

Due to generation of the above-described ringing (603), when the beam returns (enters) from the shutoff state (non-irradiation region) to the irradiation region, an error (misalignment) is generated between an original (ideal) beam irradiation position (for example, on an X-direction straight line of 600) on the sample 110 and an actual position. This error (misalignment) appears as, for example, distortion in a detected measurement image; therefore, precision is lowered.

[Promise (9)]

Figure 17A:
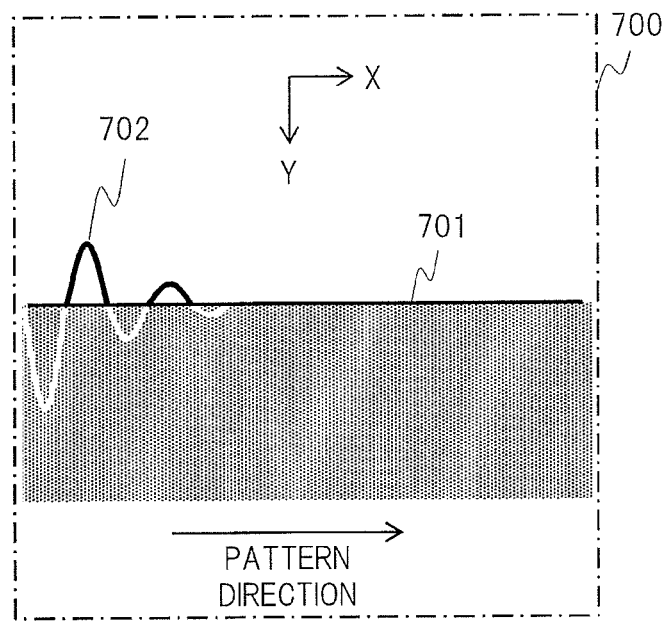
FIG. 17A is a diagram illustrating an example of misalignment in beam irradiation positions caused by ringing of an actual waveform of the (main) blanking control signal in the known case and the present embodiments.

FIG. 17A illustrates beam irradiation position misalignment in the above-described BLK control. "700" represents an image of abeam irradiation position with respect to a pattern (particularly simple edge pattern for detection) on a sample (wafer) serving as a measurement target in the plane of X-direction and Y-direction. An X-direction straight line of 701 represents an ideal beam irradiation position corresponding to a line of the pattern 600. However, due to the above-described ringing (603), misalignment (swinging) in the Y-direction beam irradiation position is generated in the manner of 702 (the trajectory of the actual irradiation position).

Figure 17B:
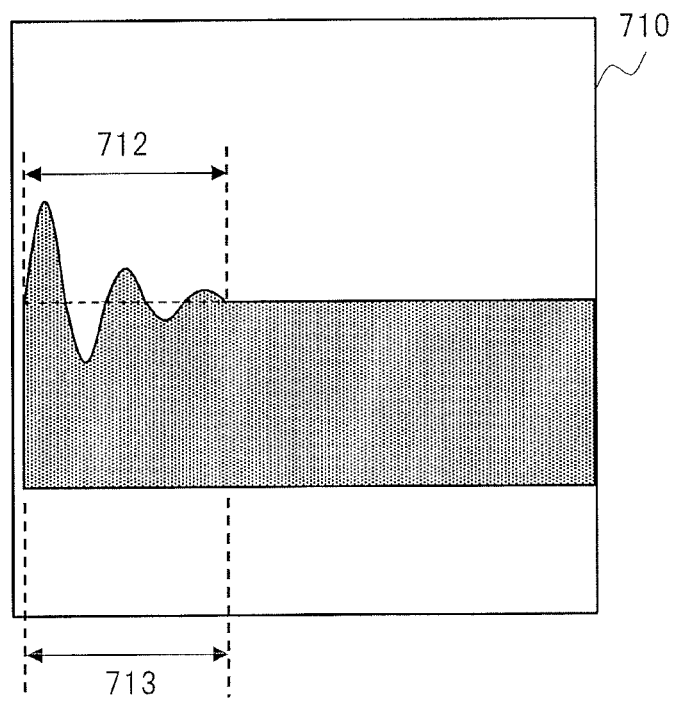
FIG. 17B is a diagram illustrating an example of measurement image distortion caused by the beam irradiation positional misalignment of 17A.

In FIG. 17B, "710" represents a measurement image (distortion thereof) corresponding to FIG. 17A. "712" represents the region of distortion caused by ringing (misalignment) corresponding to 702. "713" represents the time that is corresponding to the region of 702 and 712 and is taken until the ringing is converged to be sufficiently small (corresponding to the time points t1 to t2 of FIG. 16). In the period of 713 (corresponding spatial region), a precise image (data) cannot be obtained (becomes an unmeasurable region).

The time of 713 is defined as the settling time (stabilization period) (referred to as ST) of the beam. If this settling time ST can be shortened, high-speed scanning and high-speed BLK control can be correspondingly achieved.

The high voltage (high level) (Von: Vb) of the ON time of the above-described BLK control signal is, for example, generally, about several tens to 100 V. On the other hand, the voltage of the BLK control signal which causes the positional misalignment of one pixel in the measurement image is about several mV to 1 mV or less. Therefore, the settling time ST can be defined as the time taken from the start time point (t1) of decay of the voltage (Von: Vb) of the BLK control signal until the size of the amplitude of the ringing falls within 0.001% of the amplitude of the voltage (Von: Vb) (this timing is the time point t2).

In order to shorten the unnecessary irradiation time of the beam by high-speed scanning and high-speed BLK control in the above-described manner, the time like the above-described settling time ST has to be shortened.

The phenomenon such as the above-described ringing occurs not only in the period of switching of the signal from ON to OFF (decay), but also occurs in the period of switching from OFF to ON in the same manner. That case can be also regarded as a target of correction (shortening) in the same manner as described later.

FIG. 16 illustrates the example of voltage ringing; however, other than that, response delay and so forth may occur. The response delay refers to slightly delayed decay without immediate decay of a voltage waveform for example in the period of switching (t1) from ON to OFF. Such response delay time can be also applied as a target of correction (shortening) in the same manner as described later in the same manner as the above-described ringing.

First Embodiment

Based on the above-described conditions, a semiconductor measuring/inspecting apparatus of a scanning electron beam system of a first embodiment of the present invention and a measuring/inspecting method using the measuring/inspecting apparatus will be described with reference to FIGS. 1 to 9, etc. The first embodiment (FIG. 1, etc.) has a configuration in which, as BLK control electrodes which are elements for carrying out high-speed BLK control (high-speed ON/OFF switching control of irradiation/shutoff) along high-speed scanning of an electron beam, a correction BLK unit (the correction BLK control electrodes 20, the correction BLK control circuit 202, etc.) are newly added to the known main BLK unit (the main BLK control electrodes 10, the main BLK control 201, etc.) (FIG. 11). As a scanning system, the above-described raster scanning system, the vector scanning system, etc. can be used. As illustrated in FIGS. 2A and 2B, an electrode configuration is made such that each of main BLK and correction BLK includes two metal plates. Thus, BLK control of a particular single direction is carried out.

As a correction-data calculation processing function, a function of calculating and obtaining basic data (basic correction BLK data) for correction BLK (for generating the waveforms of the correction BLK control signal) based on actual measurement values (profile) of the main BLK control signal (particularly the waveform in the period of switching from ON to OFF) obtained by previous measurement is provided. As a correction processing function, upon measuring/inspecting, in synchronization with application of the main BLK control signal, particularly the waveform in the period of switching from ON to OFF, to the main BLK control electrodes 10, a correction BLK control signal (particularly the waveform in the period of switching from ON to OFF) generated based on the above-described basic correction BLK data is applied to the correction BLK control electrodes 20 in real time. As a result, the ringing, etc. in the period of switching from ON to OFF caused by the waveform of the main BLK is cancelled out by the waveform of the correction BLK, thereby shortening the settling time and achieving high-speed-scanning/high-speed BLK control.

[Measuring/Inspecting Apparatus (System)]

Figure 1:
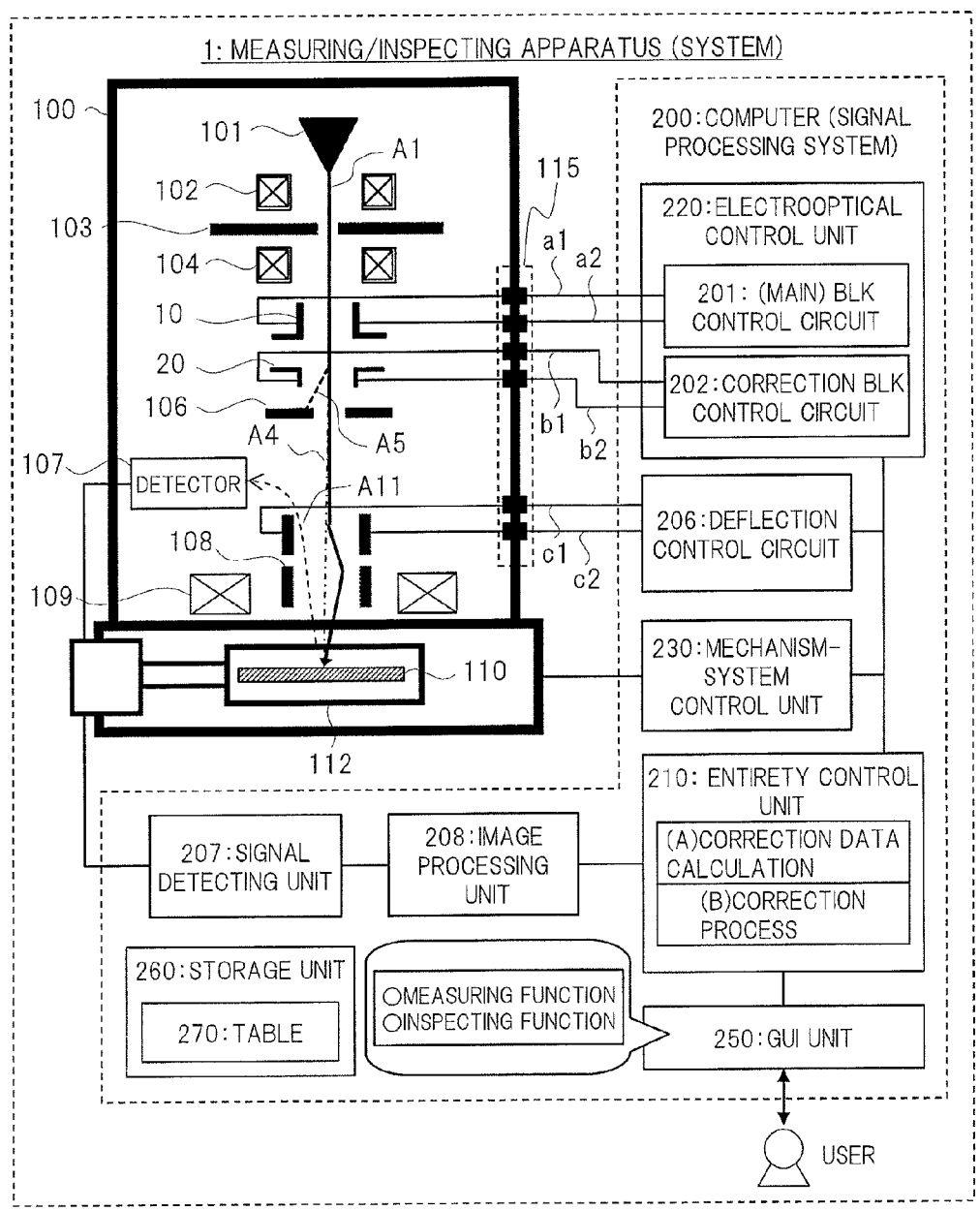
FIG. 1 is a diagram illustrating a configuration of a whole system including a semiconductor measuring/inspecting apparatus of a scanning electron beam system according to a first embodiment of the present invention.
Figure 2B:
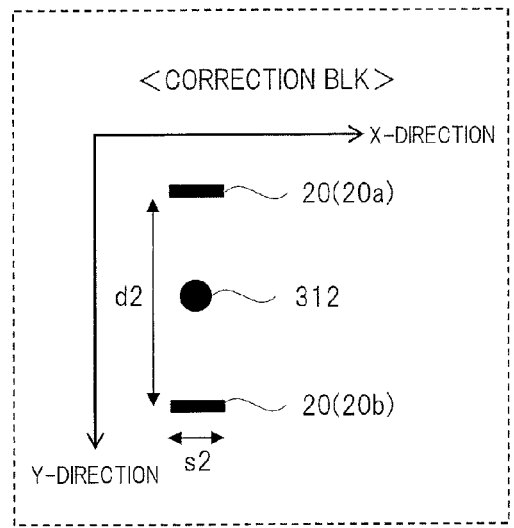
FIG. 2B is an overhead view illustrating a configuration of blanking electrodes according to the first embodiment and a known aspect.

FIG. 1 illustrates the configuration of a whole system comprised of a measuring/inspecting apparatus of the first embodiment. A main difference from the known case (FIG. 11) is that the correction BLK control unit (20, 202, etc.) is provided. Corresponding to this additional element (the correction BLK control unit), in the present embodiment, the processing contents, etc. of signal processing systems (such as an entirety control unit 210 of a computer 200) are also different. The measuring/inspecting apparatus of the first embodiment is an application example, which enables automatic measurement and an automatic inspection of a target semiconductor wafer (the sample 110). The present measuring/inspecting apparatus is provided with a measuring function of measuring the dimensional values of a circuit pattern of the semiconductor wafer (the sample 110) and an inspecting function of detecting defects (troubles or flaws) in the pattern.

The present measuring/inspecting apparatus (system) is configured to have the column 100, the sample stage 112 (stage) on which the sample 110 serving as a target of measuring/inspecting is placed, the computer (or a signal processing system) 200, etc. The computer 200 is, for example, stored in a control rack in the form of a PC, a control board, or the like. Units of the computer 200 are achieved, for example, by software program processing by, for example, a processor and a memory or processing of a dedicated circuit.

The computer 200 is provided with: the entirety control unit 210, an electrooptical control unit 220 (the BLK control circuit 201, the correction ELK control circuit 202), the deflection control circuit 206, the mechanism-system control unit 230, the signal detecting unit (secondary-electron signal detecting circuit) 207, the image processing unit (secondary-electron signal processing circuit) 208, a GUI unit (user interface unit) 250, etc.

In the column 100 (vacuum), as an irradiation system (electrooptical system): an electron gun 101, which emits an electron beam A1; a focusing lens (first condenser lens) 102, through which the emitted electron beam A1 passes; a diaphragm 103; a focusing lens (second condenser lens) 104; the main blanking control electrodes 10 (main BLK electrodes); the correction blanking control electrodes 20 (correction BLK electrodes); the aperture 106; the deflector 108; an objective lens 109; etc. are provided. As a detection system, the column 100 is provided with the detector 107, which detects secondary electrons A11 generated from the sample 110 by the radiated electron beam A1 (A4).

In the column 100 (vacuum), the electron beam A1 generated/emitted by the electron gun 101 is focused through the first condenser lens (focusing lens) 102, the diaphragm 103, and the second condenser lens (focusing lens) 104, subjected to deflection control via the deflector 108, and is subjected to irradiation while carrying out scanning on the sample 110 through the objective lens 109, etc. When the beam A1 (A4) is radiated, the secondary electrons A11 are generated from the sample 110 and are detected by the detector 107. A signal (analog signal) detected by the detector 107 is converted to a digital signal by the signal detecting unit (secondary-electron signal detecting circuit) 207. Then, based on the digital signal, a two-dimensional image is generated and processed by the image processing unit (secondary-electron signal processing circuit) 208 and is displayed by a GUI screen. Based on the contents of the image, a circuit pattern is measured (in the case of the measuring function).

The GUI unit 250 carries out a process of providing an interface such as GUI screens to a user, i.e., a person who measures/inspections). The GUI unit 250 provides the GUI screen for inputting (setting) inspection conditions, etc., the GUI screen for displaying inspection results (such as a two-dimensional image), etc. The GUI unit 250 includes, for example, input/output devices such as a keyboard and a display and a communication interface unit. The user can select and execute the measuring function or the inspecting function by the GUI screen.

In accordance with the instruction(s) made at the GUI unit 250, the entirety control unit 210 carries out a process of controlling the entirety (220, 230, 207, 208, 206, etc.) of the present system (apparatus). For example, in accordance with the measurement/inspection conditions, instructions, etc. input by the user with the screen of the GUI unit 250, the entirety control unit 210 controls the electrooptical control unit 220, the deflection control unit 206, the mechanism-system control unit 230, etc., thereby carrying out the process of measuring/inspecting. For example, upon execution of measuring/inspecting, the entirety control unit 210 receives data information such as a two-dimensional image, which has been generated through the signal detecting unit 207 and the image processing unit 208, and displays that by the screen of the GUI unit 250.

In accordance with control from the entirety control unit 210, the electrooptical control unit 220 controls the electrooptical system (irradiation system) in the column 100. Particularly, high-speed BLK control is carried out by synchronously applying the control signals (the main BLK control signal, the correction BLK control signal) to the main BLK control electrodes 10 and the correction BLK control electrodes 20 through the signal lines (a1, a2, b1, b2), etc. from the main BLK control circuit 201 and the correction BLK control circuit 202. "115" represents driver circuits/terminals connecting the lines.

In accordance with control from the entirety control unit 210, the deflection control circuit 206 applies defection control signals to the deflector 108 through the signal lines (c1, c2), thereby controlling scanning by deflection of the electron beam.

The mechanism-system control unit 230 controls a mechanism system including the sample stage 112, etc. For example, the sample stage 112 can be subjected to movement control in the Y-direction so as to correspond to scanning control of the electron beam (FIG. 14).

The computer 200 (the entirety control unit 210, etc.) of FIG. 1 is provided with both of the measuring function and the inspecting function, but may be configured to be provided with only one of them.

In the case of measuring (the measuring function), the image processing unit 208 generates a measurement image and carries out, for example, calculations of pattern dimensional values in the image. In the case of inspecting (the inspecting function), the image processing unit 208 generates an inspection image and carries out, for example, a process of detecting/determining a defect (s) in the image.

For example, the entirety control unit 210 (may be another part) in the computer 200 is provided with a function (A) of carrying out a later-described correction-data calculating process (FIG. 6) about the correction BLK control unit, a function (B) of carrying out a realtime correction process (FIG. 7), etc.

A storage unit 260 stores/manages various data information (including setting information, result information, etc.) about measuring/inspecting including a later-described table 270.

[ELK Electrode Configuration]

In FIGS. 2A and 2B, the main BLK control electrodes 10 of FIG. 2A are in the configuration of a pair as well as the above-described known case. Correspondingly, the correction BLK control electrodes 20 of FIG. 2B is in the configuration of a pair corresponding to the configuration of the main BLK control electrodes 10. This is the configuration the main BLK control electrodes 10 are particularly disposed to be opposed to each other in the Y-direction. Details thereof will be described later.

[Main BLK Control and Correction BLK Control]

The correction BLK control circuit 202 generates the correction BLK control signal (voltage) in synchronization with the main BLK control, which is carried out by the main BLK control circuit 201, and applies the signal to the correction BLK control electrode 20. This correction BLK control (the correction BLK control signals) corrects, for example, ringing generated along the main BLK control (the main ELK control signals) in real time.

If the sample 110 is not irradiated with the electron beam (shutoff ON time, blanking ON state), ON signals (predetermined voltage) of the main BLK control signal are generated and applied from the main BLK control circuit 201 to the main BLK control electrodes 10 through the signal line (a1, a2) (FIG. 13). As a result, an electric field generated at the main BLK control electrodes 10 (FIG. 2A) generates Coulomb force in the electron beam to deflect the beam. The deflected beam (A5) is deviated from the center hole of the aperture 106 and cannot irradiate the sample 110, in other words, the beam is shielded.

If the sample 110 is to be irradiated with the electron beam (shutoff OFF time, blanking OFF state), OFF signals (0 V) of the main ELK control signal are generated and applied from the main BLK control circuit 201 to the main ELK control electrode 10 through the signal line (a1, a2) (FIG. 13). During the blanking OFF time, the voltage difference applied to the main BLK control electrodes 10 becomes zero; therefore, the electric field between the main BLK control electrodes 10 is eliminated. As a result, the beam (A5) deflected by the electrodes is in a free state, again passes through the center hole of the aperture 106 below the electrodes, and irradiates the sample 110.

In the present embodiment, when the state of blanking is switched from ON to OFF (time point t1) by the above-described main BLK control, corresponding to the switching, a characteristic correction control signal (waveform) is applied (FIG. 4, etc.) by the correction BLK control signal from the correction BLK control circuit 202 to the correction ELK control electrode 20. The correction BLK control signal is generated based on basic correction BLK data (D2) that is created based on profile data (D1) of the electric-field ringing of the main ELK control signal measured beforehand under measurement conditions.

Figure 3:
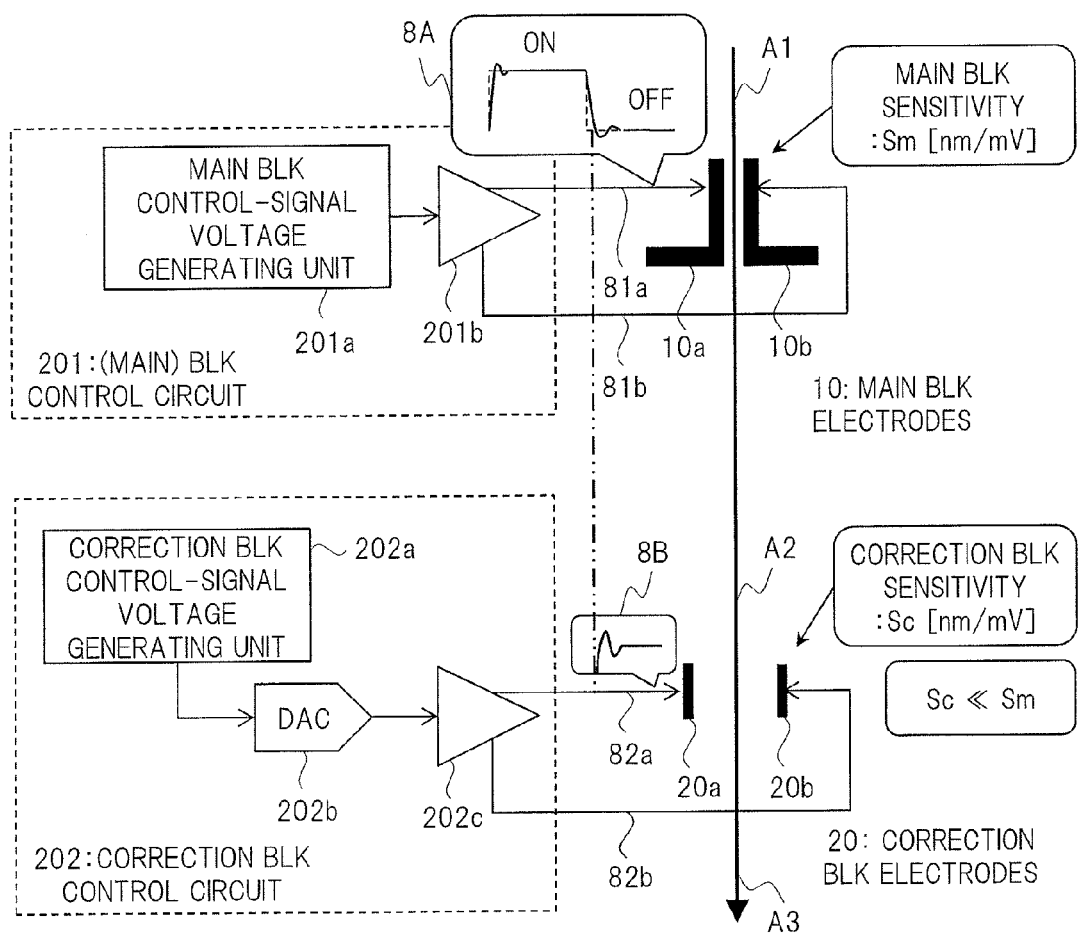
FIG. 3 is a diagram schematically illustrating the configuration about the blanking electrodes and circuits and sensitivity thereof according to the first embodiment.
Figure 4:
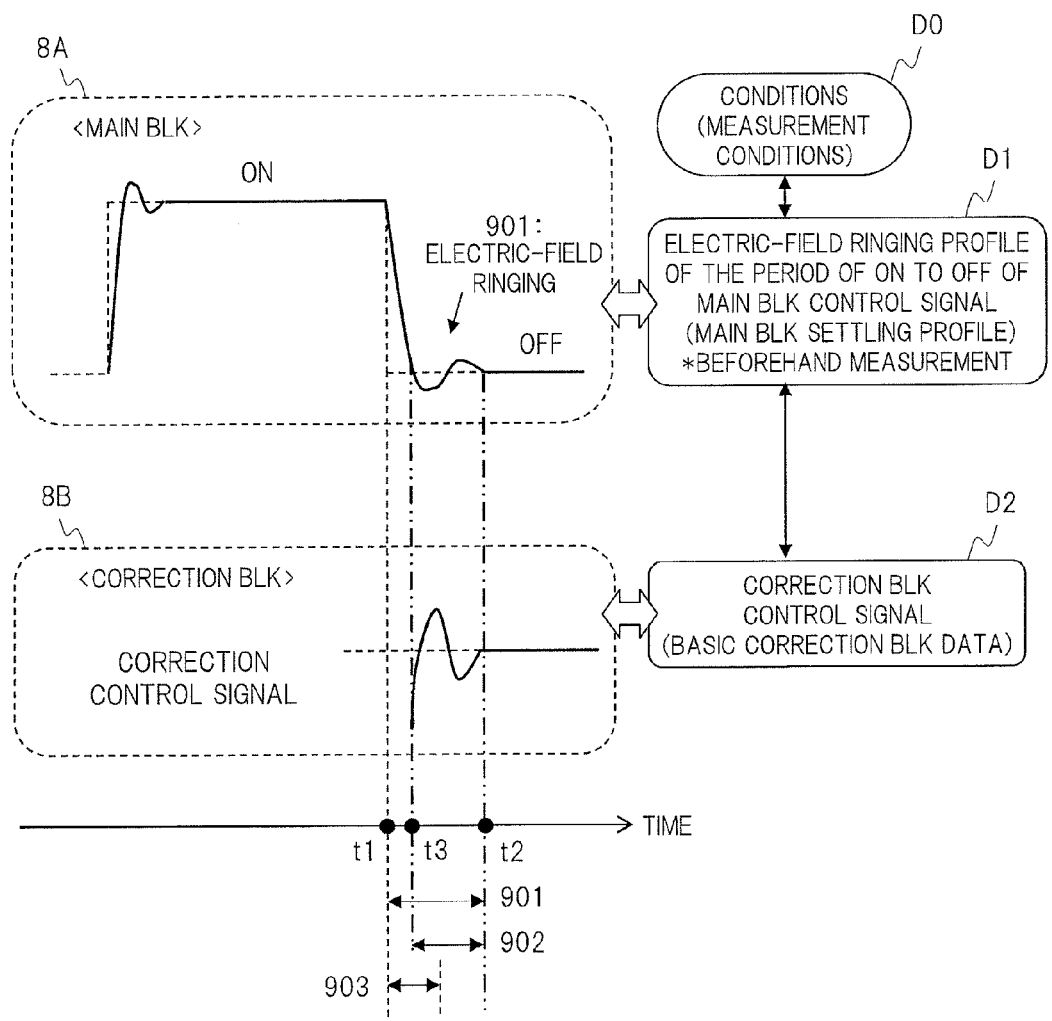
FIG. 4 is a diagram illustrating a relation, etc. of waveforms of a main blanking control signal and a correction blanking control signal.

FIG. 4 illustrates the waveforms (8A, 8B) of the control signals of FIG. 3. "8A" represents part of the vicinity of the switching time (t1) from ON to OFF as an example of an actual voltage waveform of the main BLK control signal applied to the main BLK control electrode 10. "901" (t1 to t2) represents the part of the above-described electric-field ringing (voltage ringing) and corresponds to the above-described known settling time ST (before correction). "8B" represents an example of an actual voltage waveform of the correction BLK control signal (correction control signal) applied to the correction BLK control electrode 20 at the timing (t3 to t2) corresponding to 8A. "902" (t3 to t2) represents main application time and waveform of the correction control signal and has an opposite-phase waveform with respect to the phase of the waveform of the ringing of 901.

Figure 5:
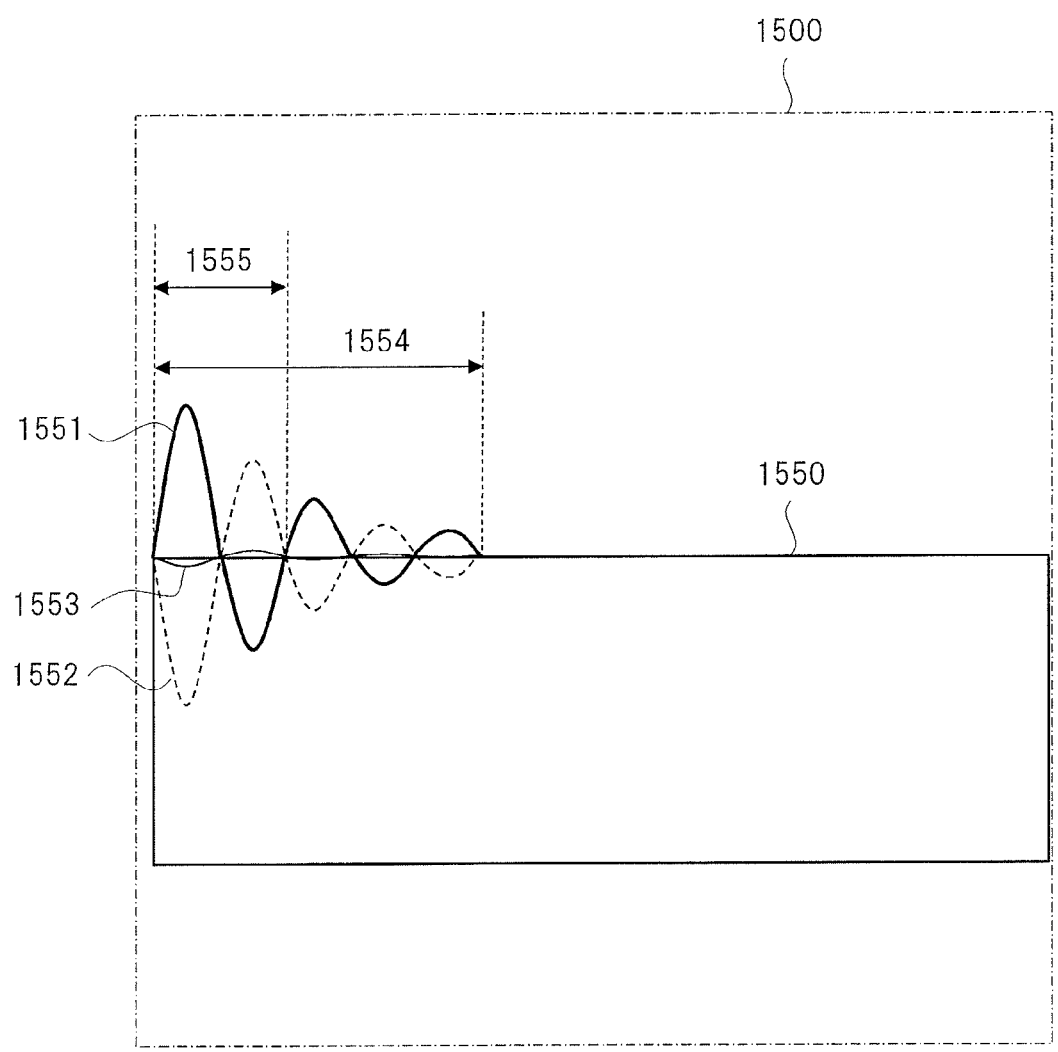
FIG. 5 is a diagram illustrating effects of combining main blanking control and correction blanking control.

FIG. 5 illustrates beam irradiation position misalignment, correction, etc. of main BLK and correction BLK at a measurement sample 1500. "1550" represents an ideal irradiation position (the case of an edge pattern for detection), "1551" represents positional misalignment caused by the waveform (8A) of the main BLK control signal, "1552" represents positional correction caused by the waveform (8B) of the correction BLK control signal, and "1553" represents the waveform of a joined effect of the main BLK and the correction BLK.

As illustrated in FIGS. 4 and 5, the above-described correction control signal (8B) has the opposite-phase waveform with respect to the waveform (8A) of the switching time of the main BLK control signal from ON to OFF so that the ringing, etc. thereof can be cancelled out to more flatten the waveform as a result. Based on the correction control signal (8B), an electric field in the opposite direction of that of the ringing electric field generated between the main BLK control electrodes 10 is generated between the correction ELK control electrodes 20. By virtue of the effect of correction (1552) of the beam position trajectory by the electric field using the correction control signal (8A), irradiation of the beam can be carried out so that the irradiation position misalignment of the beam caused by the ringing electric field between the main BLK control electrodes 10 (702 of FIG. 17A, waveform 1551 of FIG. 5) can be more flattened (convergence is shortened) toward the original (ideal) position (1550) like the waveform 1553.

As a result, the region of (time corresponding to) the beam irradiation positional misalignment upon switching of blanking from the ON to OFF state is reduced like 1555 in the present embodiment as compared with known 1554, in other words, the settling time ST is shortened. Thus, high-speed scanning and high-speed BLK control (speed up) of the beam can be achieved, and precision of the measurement/inspection can be improved.

[Sensitivity Design]

The configurations, designing of sensitivity thereof, etc. of the main BLK control electrodes 10, the correction BLK control electrodes 20, the main BLK control circuit 201, and the correction BLK control circuit 202 will be described with reference to FIG. 3.

The main BLK control circuit 201 is comprised of a main BLK control-signal voltage generating unit 201a, a driver circuit 201b, etc. The main BLK control-signal voltage generating unit 201a generates a main BLK control signal (corresponding to (b) of FIG. 13) and gives the signal to the driver circuit 201b. The driver circuit 201b (corresponding to the driver 115 of FIG. 1) applies the main BLK control signal (for example, a waveform like 8A) to the main BLK control electrode 10 (10a, 10b) in the column 100 via a transmission line 81a, 81b (in a correspondence relation with the signal line a1, a2 of FIG. 1) in the column 100.

The correction BLK control circuit 202 is comprised of a correction BLK control-signal voltage generating unit 202a, a DAC (digital/analog converter) 202b, a driver circuit 202c, etc. The correction BLK control-signal voltage generating unit 202a generates a correction BLK control signal (described later) and gives the signal to the DAC 202b. The DAC 202b converts the digital correction BLK control signal to an analog signal and gives the signal to the driver circuit 202c. The driver circuit 202c (corresponding to the driver 115 of FIG. 1) applies the correction BLK control signal (for example, waveform like 8B) to the correction BLK control electrode 20 (20a, 20b) in the column 100 via a transmission line 82a, 82b (in a correspondence relation with the signal line b1, b2 of FIG. 1) in the column 100.

Also, FIG. 3 illustrates the sensitivity by the main BLK control electrode 10 as Sm and illustrates the sensitivity by the correction BLK control electrode 20 as Sc. The unit of sensitivity is [nm/mV] (deflection distance per voltage). In the present embodiment, in order to facilitate correction, the sensitivity Sc of the correction BLK is configured to be smaller than the sensitivity Sm of the main BLK to enable correction in the correction BLK with a comparatively large control voltage compared with that of the main ELK (i.e., with respect to a size of the beam irradiation position misalignment at the main BLK control electrodes 10 having high sensitivity, in order to cause the positional correction in the same size by the correction BLK control electrodes 20 having the low sensitivity, a control voltage is required to be relatively large with respect to the main BLK). In the present embodiment, a ratio of sensitivities is 1/10 (relation equal to or less than 1/10), for example, the sensitivity Sm of the main BLK is 10, and the sensitivity Sc of the correction BLK is 1. In this case, in the main BLK, if a noise voltage (error) is for example 0.1 mV, misalignment caused by that is 1 nm; and, correspondingly, in the correction BLK, if a noise voltage (control voltage) is 1 mV, misalignment (position correction) is 1 nm. Thus, in the correction BLK, positional misalignment of 1 nm can be corrected by the unit of 1 mV, which is easy to handle.

The size of the beam irradiation positional misalignment caused by the voltage ringing of the above-described main BLK control signal is proportional to the amplitude of the ringing voltage and the sensitivity of the main BLK control electrode 10. The sensitivity of the BLK electrode is related to the interelectrode distance and electrode size thereof. For example, the longer the interelectrode distance, the lower the sensitivity; and, the smaller the electrode size, the lower the sensitivity. Designing of the above-described sensitivities Sm and Sc can be adjusted by the interelectrode distance, the electrode size, etc. of the BLK electrodes (10, 20). In FIGS. 2A and 2B, the distance between the main BLK control electrodes 10 (10a, 10b) is d1, the size (length, area, etc.) of the electrodes (metal plates) is s1, the distance between the correction BLK control electrodes 20 (20a, 20b) is d2, and the size of the electrodes (metal plates) is s2.

If the sensitivity Sc is set to 1/10 with respect to the sensitivity Sm in FIG. 3, adjustment is made, for example, by increasing d2 with respect to the interelectrode distance d1 or reducing s2 with respect to the size s1. The present measuring/inspecting apparatus is configured to set the above-described sensitivities Sm and Sc in the relation of 1/10 in advance according to the above-described electrode configuration. If an apparatus configuration in which the above-described interelectrode distance and the electrode size are variable is employed, the above-described sensitivities can be variably adjustable; therefore, such a mode may be used.

[Profile, Basic Correction BLK Data]

In FIG. 4, "D1" represents the profile of the electric-field ringing corresponding to the waveform (8A, 901) of the time of switching of the main BLK control signal from ON to OFF (main BLK settling profile). The data (D1) is stored in the table 270 (FIG. 8) by a process of beforehand measurement in the present measuring/inspecting apparatus. "D2" represents the data corresponding to the waveform (8B, 902) of the correction BLK control signal (basic correction BLK data). This data (D2) is created by (A) a correction-data calculating process (FIG. 6) of FIG. 1 in the present measuring/inspecting apparatus based on the above-described profile data (D1) and is stored in the table 270 (FIG. 8). "D1" and "D2" are managed in association with measurement conditions (D0).

Upon application of the waveform (8A) of the main BLK control signal from the main BLK control circuit 201 in the present measuring/inspecting apparatus, the correction BLK control signal including the waveform (8B) generated based on the basic correction BLK data (D2) by (B) a correction process (FIG. 7) of FIG. 1 is used. More specifically, in real time in synchronization with the application of the main BLK control signal, the correction BLK control signal is applied from the correction BLK control circuit 202 to the correction BLK control electrode 20.

[(A) Correction Data Calculating Process]

Next, by using FIG. 6, a process of calculating the correction data (correction conditions) with respect to the ringing, etc. at the beam position of the time of switching of blanking from ON to OFF in the present measuring/inspecting apparatus (the correction-data calculation processing function provided in the computer 200) and method will be explained.

Hereinafter, the case of the measuring function will be explained; however, the case of the inspecting function is also similar thereto (for example, measurement conditions can be replaced by, for example, inspection conditions). In this example of the correction-data calculating process, the main BLK settling profile data (D1) and the basic correction BLK data (D2) of FIG. 4 is obtained.

(S11) First, in step S11, all the measurement conditions such as measurement conditions which can be used during actual measurement and an IP current and an acceleration current, with which the sensitivities (Sm, Sc) of the deflection of the BLK electrodes (10, 20) are varied, are listed and set in order by user operations from the screen of the GUI unit 250. For example, the values of condition items listed in advance are displayed by the screen and are checked or updated by the user. The data information of the measurement conditions (D0) is retained.

(S12) The present measuring/inspecting apparatus starts measurement based on a user execution instruction under the above-described set measurement conditions, operates corresponding units by control from the entirety control unit 210, irradiates the sample 110 with a beam, and acquires a measurement image (measurement data) through the detector 107, the image processing unit 208, etc. In this process, the main BLK control signal is applied from the main BLK control circuit 201 to the main BLK control electrode 10. In order to obtain the profile data (D1) of the main BLK, correction BLK is not carried at this point, for example, the function of the correction BLK is controlled from the entirety control unit 210 to be in an off state.

In the main BLK control, as described above (FIG. 16, etc.), first, a blanking ON state is once obtained, and the application voltage to the main BLK control electrode 10 is set to the predetermined voltage (Von), thereby shielding the beam from the sample 110 (A1 to A5). Then, the beam is returned to an irradiation state by switching the ON state to the OFF state (the voltage applied to the main BLK control electrode 10 is set to 0 V (Voff)).

At this point, from the measurement image obtained through 208, etc., the present apparatus (correction-data calculation processing function) obtains the data of the profile of the waveform of, for example, ringing or response delay in the time corresponding to the settling time ST of the above-described time of switching of blanking from ON to OFF (FIG. 4, 8A). This is retained as the main BLK settling profile data (D1).

(S13) Next, the present apparatus calculates the voltage waveform (FIG. 4, 8B) of the correction BLK control signal necessary for correcting the beam positional misalignment (the waveform of the corresponding profile (D1)) under the above-described measurement conditions (D0). This is retained as the basic correction BLK data (D2).

(S14, S15) The present apparatus similarly carries out the process/operation of above-described S12 to S13 for each of all the measurement conditions (D0) of S11. After the process is finished for all the conditions (D0), the process proceeds to S15. In S15, the present apparatus assembles: the possible measurement conditions (D0) under which the sensitivities (Sm, Sc) of deflection of the BLK electrodes (10, 20) are varied upon usage of the apparatus, the main BLK settling profile (D1) corresponding to that, and the basic correction BLK data (D2) corresponding to that into the form of, for example, a correlation map (look-up table) and stores it in the table 270 of FIG. 8 as recipes (lists) respectively for the conditions (D0).

[Table]

Figure 6:
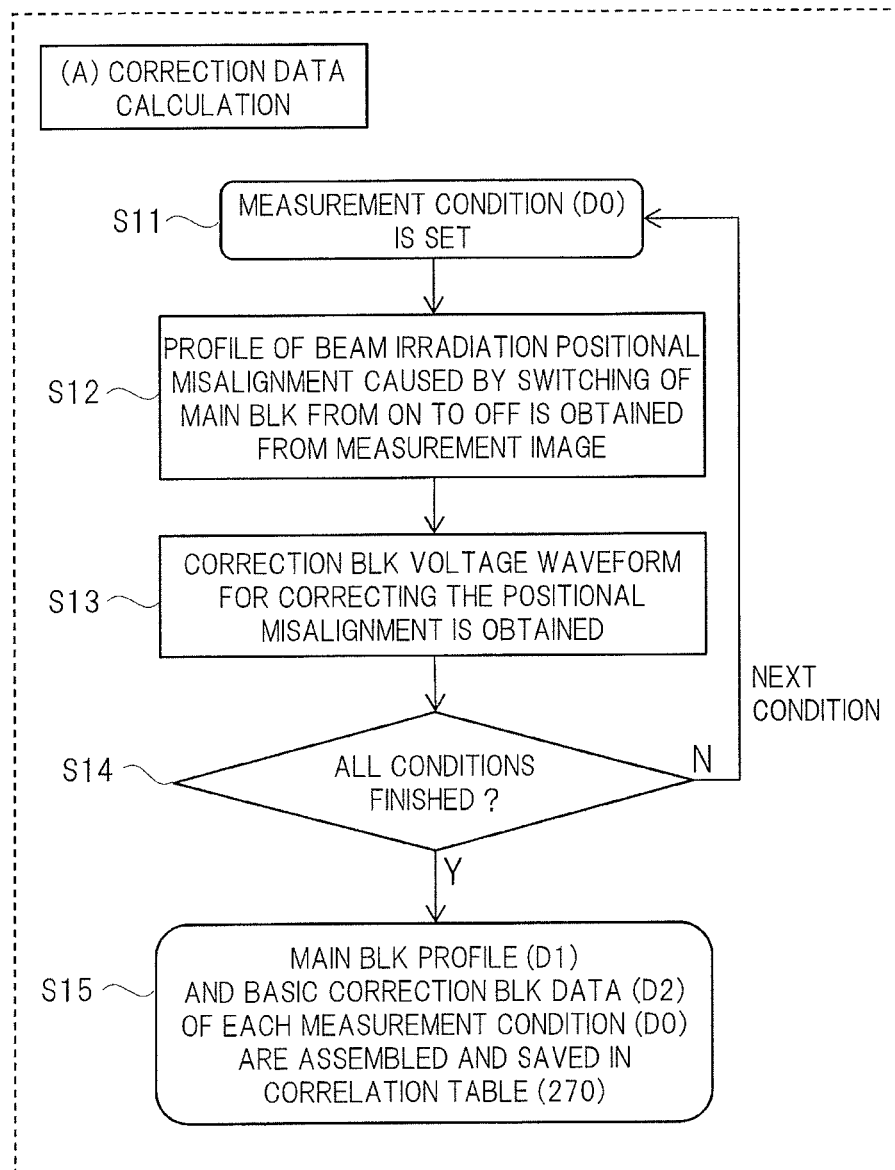
FIG. 6 is a diagram illustrating a flow of a correction-data calculating process according to the first embodiment.

FIG. 8 illustrates a configuration example of the table 270 (correlation table), which stores the data (D0, D1, D2) obtained in accordance with FIG. 6, etc. The present table 270 has, as items (columns), "condition" (measurement condition in this case) of "a", "main BLK settling profile" of "b", and "basic correction ELK data" of "c". For each of the conditions 1 to N of "a", a profile of "b" and basic correction BLK data of "c" are associated and stored. Specifically, the condition of one row of "a" may be a recipe consisting of, for example, set values of a plurality of condition elements (for example, parameters).

The conditions (D0) of "a" can be set by the user with, for example, the GUI unit 250. The profile (D1) of "b" is data information according to the actual measurement value (s) according to the main BLK control signal generated by the above-described main BLK control circuit 201. The actual measurement value(s) particularly includes the waveform (8A) of the settling time ST of the time of switching from ON to OFF. The basic correction BLK data (D2) of "c" is data information of the basic waveform (including the correction control signal (8B)) used for generating the correction BLK control signal in the correction ELK control circuit 202.

When the data (D1) of the profile of the main BLK is to be acquired by the above-described beforehand measurement, this may be achieved by the measuring function of the present measuring/inspecting apparatus, or the data may be measured and acquired by an existing apparatus (apparatus provided only with the main ELK control unit). Alternatively, the data (D1) of the profile may be configured to be able to be acquired when needed by the measuring function of the present measuring/inspecting apparatus, or the data may be set in advance at the point of manufacturing of the present apparatus.

[GUI Screen]

Figure 9:
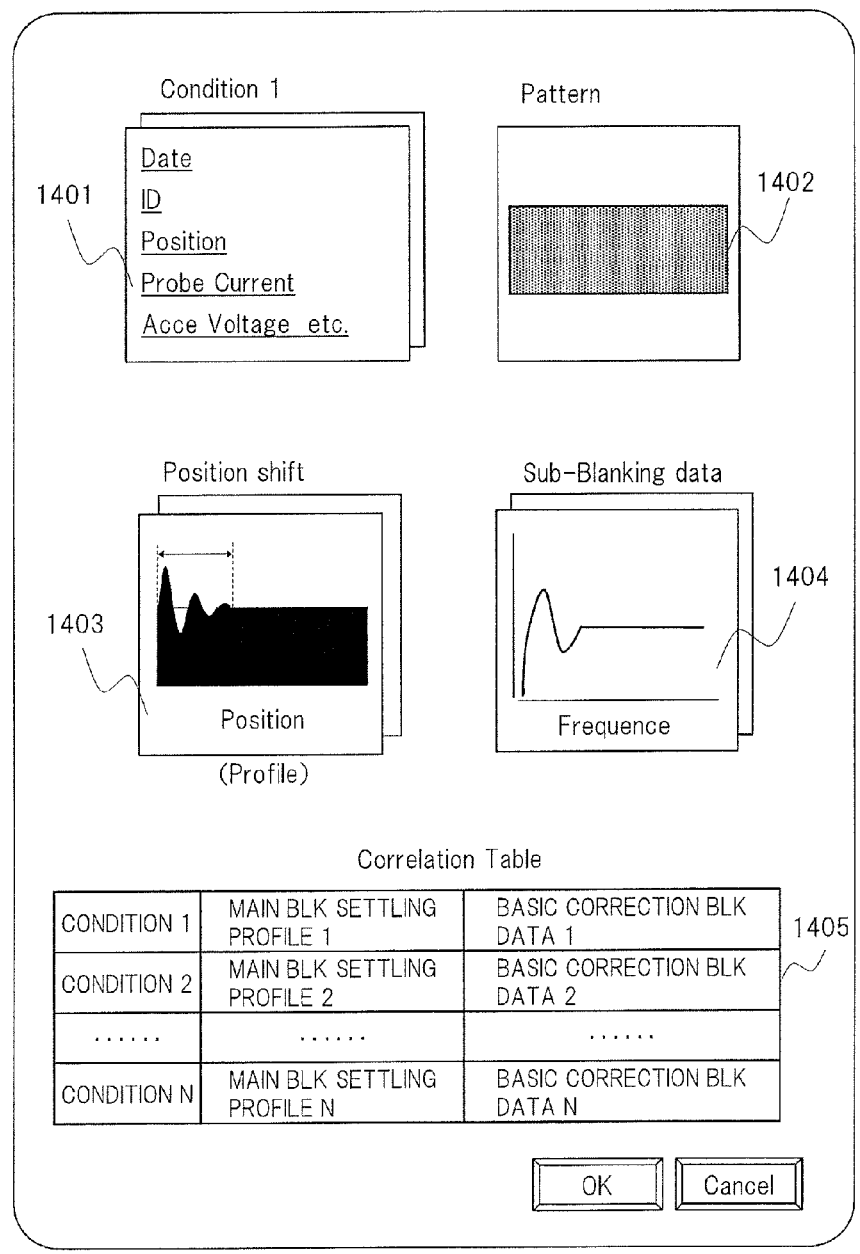
FIG. 9 is a diagram illustrating an image of a GUI screen example.

FIG. 9 illustrates an image of a GUI screen example displayed by the GUI unit 250 in the present embodiment. Particularly, the drawing illustrates an example of obtaining the basic correction BLK data (D2) of the profile (D1) of the main BLK settling time and setting a correlation map thereof in the table 270.

In the present screen, "1401" illustrates the information about the above-described measurement/inspection conditions (D0) respectively for conditions and respectively for elements (date, ID, position, current, voltage, etc.). "1402" illustrates a simple pattern for acquiring the profile (D1), wherein the pattern is a detection edge pattern about beam scanning (irradiation) positional misalignment of the settling time ST of the main BLK. "1403" illustrates a waveform (an image thereof) illustrating scanning (irradiation) positional misalignment caused by, for example, ringing of the beam obtained by actual (beforehand) measurement in relation to the beam scanning (irradiation) positional misalignment in the settling time ST of the main BLK and corresponds to the data of the profile (D1). "1404" illustrates the waveform (an image thereof) of the basic correction BLK data (D2) for correction BLK used for correcting the misalignment of 1403. "1405" illustrates contents of the table 270 of FIG. 8 including the information corresponding to 1401 to 1404. The user can arbitrarily check/adjust these contents.

[(B) Correction Process]

Figure 7:
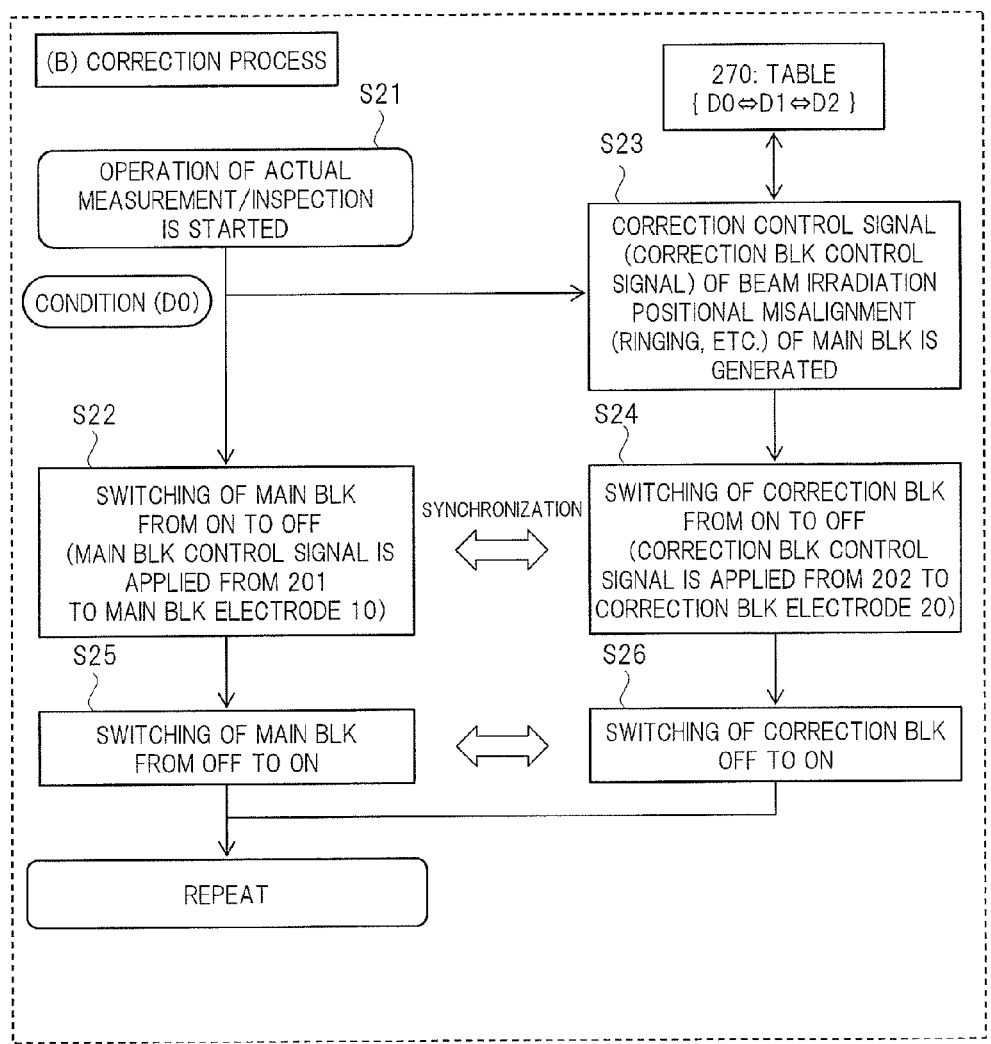
FIG. 7 is a diagram illustrating a flow of a real-time correction process according to the first embodiment.

Next, by using FIG. 7, a process of correcting ringing, etc. (beam irradiation positional misalignment) by correction BLK in the period of switching of the main BLK from ON to OFF in real time for achieving high-speed scanning and high-speed BLK control during actual measuring/inspecting in the present measuring/inspecting apparatus ((A) the correction processing function provided at the computer 200) and method will be explained.

(S21) First, in step S21, the present measuring/inspecting apparatus carries out beforehand adjustment condition setting (recipe setting), etc. which require normal measuring and inspecting and starts actual measuring and inspecting (explanation will be omitted since these are general operations). The conditions (D0) set in the table 270 can be referenced/used. The profile (D1) associated with the condition (D0) and the basic correction BLK data (D2) are used in the below process.

(S22) In S22, along with high-speed scanning control (for example, deflection control from the deflection control circuit 206) of the beam, the present apparatus applies the main BLK control signal from the main BLK control circuit 201 to the main BLK control electrode 10. Particularly, in the waveform thereof, the ON state of the main BLK is switched to the OFF state.

(S23) In synchronization with above-described S22, switching of the correction BLK from ON to OFF is carried out in S24. In order to do that, in S23, the waveform (8B) of the correction control signal for the positional misalignment caused by the waveform (8A) of the main BLK is generated based on reference of the basic correction BLK data D2 (the data corresponding to the condition (D0) selected in S21) of the table 270. An actual application voltage waveform can be generated by simple computing with respect to the waveform of the basic BLK correction data.

(S24) In S24, in synchronization with the operation of the main BLK, the correction BLK control signal including the waveform (8B) generated in above-described S23 is applied from the correction BLK control circuit 202 to the correction BLK control electrode 20 through the signal line, etc. As a result, as described above, an electric field in the opposite direction of the ringing electric field, generated between the main BLK control electrodes 10, is generated between the correction BLK control electrodes 20, thereby correcting the beam irradiation positional misalignment caused by the main BLK. Thus, the settling time ST in the period of switching of blanking from ON to OFF (S22, S24) is shortened.

(S25, S26) In S25 and S26, similarly, switching of the main BLK from the OFF to ON state and switching of the correction BLK from the OFF to ON state are synchronously carried out by the control signals of the main BLK and the correction BLK. Thereafter, similar repetitions are carried out, and the measuring/inspecting is finished when a predetermined condition(s) is satisfied.

[Effects, etc.]

In the above-described first embodiment, along with the high-speed scanning of the beam, the ringing, response delay, etc. which have occurred in the period of switching of the main BLK from ON to OFF can be corrected in real time. Therefore, the settling time ST, which has been a drawback in the known beam scanning, can be shortened, high-speed scanning and high-speed BLK control can be achieved, and the precision of measuring/inspecting becomes high as a result. Therefore, problems such as measurement errors in the circuit pattern dimensions caused by the influence of electrification with respect to the sample 110 and false defects in which the precision of defect detection is lowered can be solved. Thus, improvement in the measurement precision of the pattern dimensions, improvement in defect detection precision (inspection precision), etc. can be achieved. Furthermore, this can be utilized, for example, for reducing apparatus differences between a plurality of apparatuses (measuring/inspecting apparatuses).

Second Embodiment

Next, a semiconductor measuring/inspecting apparatus of the scanning electron beam system of a second embodiment of the present invention will be explained by using FIGS. 10A and 10B. Basic configurations of the apparatus of the second embodiment are similar to those of the first embodiment (FIG. 1, etc.), and different parts will be described below. In the second embodiment, as illustrated in FIG. 10, as the configuration of the BLK electrodes, the main BLK control electrodes 10 are comprised of four metal plates, and the correction BLK control electrodes 20 are also comprised of four metal plates. More specifically, BLK control in an arbitrary direction is configured to be enabled by independently controlling them in X-direction and Y-direction. In the second embodiment, the BLK control in the arbitrary direction can be carried out; therefore, scanning of an arbitrary pattern shape can be also flexibly supported limitations on applicable shapes/directions, etc. are reduced. In the second embodiment, corresponding to the above-described electrode configurations, the control processing contents, etc. in the computer 200 of FIG. 1 (the entirety control unit 210, the correction BLK control circuit 202, etc.) are configured to be partially different.

FIGS. 10A and 10B are overhead views (X-Y planes) of the configurations of the BLK control electrodes 10 and 20 provided in the measuring/inspecting apparatus of the second embodiment. FIG. 10A illustrates the main BLK control electrodes 10 (10a to 10d) which consist of four metal plates mutually opposed in the X-direction and Y-direction and disposed in a square shape. Corresponding to this, FIG. 10B illustrates the correction BLK control electrodes 20 (20a to 20d) which similarly consist of four metal plates disposed to be mutually opposed in the X-direction and Y-direction. In each of the drawings, the two electrodes (for example: 10c, 10d) in the X-direction form one pair (Xb), and the two electrodes (for example: 10a, 10b) in the Y-direction form one pair (Yb). The deflection (shielding) of the beam in an arbitrary direction in the X-Y plane can be controlled by controlling the electric fields between the X-direction electrodes (Xb) and the Y-direction electrodes (Yb) by control signals from the BLK control circuits 201 and 202.

For example, in each of the main BLK and the correction BLK, the two pairs of electrodes (Xb, Yb) in the mutually orthogonal X-direction and Y-direction are configured so that the pairs of electrodes can be independently controlled by the BLK control signals from the BLK control circuits (for example, a first main BLK control circuit for Xb, a second main BLK control circuit for Yb) independently provided to correspond to the pairs, respectively. In addition, the above-described BLK control circuits are configured to be able to generate, as the generated BLK control signals, analog voltage signals at arbitrary levels between a low level and a high level in addition to the high level (for Von, for example, 100V) and the low level (for Voff, for example, 0 V) as well as the known case.

In a measuring/inspecting apparatus such as a known SEM, BLK electrodes (and BLK control circuits) are configured to be required only for the function of controlling ON/OFF switching of the irradiation/shielding of the beam. Therefore, as described above, the electrodes generally consist of two metal plates, and deflection control of the beam can be carried out only in one particular direction. In the example of FIG. 2A, the two electrodes 10a and 10b are disposed to be opposed to each other in the Y-direction. In that case, the electric field generated by the voltage signals applied between the electrodes or a remaining voltage signal is always in the Y-direction, and the beam is always deflected (shielded) along the Y-direction by the ELK control. Corresponding to this configuration, in the scanning region on the sample 110, each of X-direction lines is scanned (FIG. 14).

In the above-described case, the ringing, etc. of the voltage generated when blanking is switched from ON to OFF cause only the scanning (irradiation) positional misalignment of the beam in the Y-direction (FIG. 17A, etc.). If the pattern direction (corresponding line scanning direction) of a measurement target on the sample 110 is only in the X-direction, the above-described Y-direction positional misalignment has small influence on the X-direction pattern. Therefore, in the first embodiment, by virtue of the effect of the correction BLK control, the influence is small also on the pattern of the measurement image, and distortion is not generated in the measurement image. Therefore, shortening of the length of the settling time ST, which is an obstacle of high-speed scanning, can be achieved.

However, the direction of the pattern of the target sample 110 can be an arbitrary direction. The case of such an arbitrary direction cannot be flexibly supported by the configuration of the fixed-direction BLK control like that of the first embodiment. Therefore, as described above, the second embodiment is configured so that the deflection control of the beam in both of X-direction and Y-direction can be carried out by the X- and Y-direction four BLK electrodes, control of the simultaneous application of the control voltages at mutually different levels in the X-direction (Xb) and the Y-direction (Yb) is enabled, and deflection control of the beam in an arbitrary direction in the X-Y plane is enabled by virtue of that. Therefore, scanning of the pattern in an arbitrary direction on the target sample 110 of measuring/inspecting can be also flexibly supported.

In the above-described configuration, in the period of switching of blanking from ON to OFF, if the direction of returning the beam is configured to be controlled depending on the arbitrary pattern direction, which varies, (for example, the beam is controlled so as to be in the direction orthogonal to the pattern direction), even when ringing, etc. are somewhat generated at the electric field of the main BLK control, distortion can be prevented from being generated in the pattern of the measurement image by a combination with the effect of the correction BLK control. Thus, high-speed scanning can be achieved by shortening the settling time ST.

Modification Example

As another embodiment (modification example), not limited to the configuration of four BLK electrodes like the above-described second embodiment, a configuration of a plurality of electrodes (metal plates) and a control circuit in which consideration is made so that the beam deflection direction can be controlled to a desired direction may be employed. For example, not only a layout like a square shape consisting of four plates, but also a circular layout of six or more plate may be employed.

Moreover, as a modification example, the electrode configurations (the number, directions) of the main BLK and the correction BLK are not limited to be uniform like the first and second embodiments; and, for example, a configuration of a combination of two plates of the main BLK control electrodes 10 (FIG. 2A) and four plates of the correction BLK control electrodes 20 (FIG. 10B) may be employed. Thus, in that case, fine adjustment can be carried out by the correction BLK with respect to the fixed-direction main BLK.

In FIG. 2, the configuration of an X-direction opposed layout is employed. However, the configuration is not limited to that, and a configuration of an opposed layout in particular one direction (for example, the direction at 45 degrees with respect to X) may be employed.

Also in a configuration of the measuring/inspecting apparatus with no correction BLK unit, only the main BLK control electrodes (and a corresponding circuit, etc.) may be configured to be controllable in an arbitrary direction by, for example, the above-described four (two sets of) electrodes. In that case, the effect of correction by the correction BLK cannot be obtained; however, corresponding effects can be obtained by the control of BLK (shutoff) in the arbitrary direction.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A measuring/inspecting apparatus for carrying out at least one of measuring and inspecting of a sample by a scanning electron beam system, the measuring/inspecting apparatus comprising:
    an entirety control unit that controls the measuring/inspecting apparatus and articulates a measuring or inspecting process;
    an interface unit that provides a user interface for an operation including the measuring or the inspecting;
    an electrooptical system that includes an optical lens for irradiating the sample with an electron beam;
    an electrooptical control unit that controls the electrooptical system;
    a deflector for controlling an irradiation position by deflection for scanning control of the electron beam with respect to the sample;
    a deflection control circuit that generates a control signal and applies the control signal to the deflector;
    a detector that detects a secondary electron or other energy generated from the sample as a result of irradiation with the electron beam;
    a signal processing system that processes a signal detected by the detector, generates an image of the measuring or the inspecting, and outputs the image to a user;
    a storage unit that stores data information about the measuring or the inspecting;
    a main blanking unit for controlling shutoff of the irradiation of the electron beam with respect to the sample;
    a correction blanking unit for correction with respect to the main blanking unit; and
    an aperture for shutting off the electron beam; wherein
    the main blanking unit has a main blanking electrode and a main blanking control circuit that generates a main blanking control signal and applies the main blanking control signal to the main blanking electrode;
    the correction blanking unit has a correction blanking electrode and a correction blanking control circuit that generates a correction blanking control signal and applies the correction blanking control signal to the correction blanking electrode; and
    in a period of switching of the state of shutoff of the electron beam from ON to OFF by applying the main blanking control signal from the main blanking control circuit to the main blanking electrode, positional misalignment of the irradiation of the electron beam caused by the main blanking control signal is corrected by applying the correction blanking control signal from the correction blanking control circuit to the correction blanking electrode.

2. The measuring/inspecting apparatus according to claim 1, further comprising
    a correction-data calculating unit that carries out:
        a process of acquiring data of a profile including a first waveform corresponding to ringing in the period of switching of the state of shutoff of the electron beam from ON to OFF by applying the main blanking control signal from the main blanking control circuit to the main blanking electrode by using a predetermined detection pattern while turning off the correction blanking unit in beforehand measurement under a condition set by the user in advance;
        a process of calculating correction data for generating the correction blanking control signal including a second waveform for cancelling out and more flattening the first waveform of the main blanking control signal by using the data of the profile; and
        a process of mutually associating the condition, the profile, and the correction data, storing the condition, the profile and the correction data in a table, and saving the table in the storage unit.

3. The measuring/inspecting apparatus according to claim 1, wherein
    a direction of irradiating the sample with the electron beam is a Z-direction, directions of a plane perpendicular to the Z-direction are X-direction and Y-direction;
    the apparatus further comprising a correction processing unit that carries out:
        a process of deflecting the electron beam in the plane of the X-direction and Y-direction by applying the control signal from the deflection control circuit to the deflector in accordance with the scanning control of the electron beam with respect to the sample when measuring or inspecting is carried out in a predetermined scanning system based on a condition set by the user;
        a process of deflecting the electron beam in the plane of the X-direction and Y-direction to shut off the aperture by applying the main blanking control signal from the main blanking control circuit to the main blanking electrode in accordance with main blanking control of the electron beam with respect to the sample synchronized with the scanning control; and
        a process of deflecting the electron beam in the plane of the X-direction and Y-direction by applying the correction blanking control signal from the correction blanking control circuit to the correction blanking electrode in accordance with correction blanking control of the electron beam with respect to the sample synchronized with the main blanking control; and
    by virtue of the above-described configuration, the positional misalignment of the electron beam caused by the main blanking unit is corrected by the correction blanking unit in real time.

4. The measuring/inspecting apparatus according to claim 1, wherein
    a direction of irradiating the sample with the electron beam is a Z-direction, directions of a plane perpendicular to the Z-direction are X-direction and Y-direction;
    the main blanking electrode is configured of a pair of metal plates opposed to each other in a particular first direction in the plane of the X-direction and Y-direction; and the correction blanking electrode is configured of a pair of metal plates opposed to each other in the particular first direction as well as the main blanking electrode.

5. The measuring/inspecting apparatus according to claim 1, wherein
a direction of irradiating the sample with the electron beam is a Z-direction, directions of a plane perpendicular to the Z-direction are X-direction and Y-direction;
the main blanking electrode is configured of four metal plates in total including a pair of metal plates opposed to each other in a first direction in the plane of the X-direction and Y-direction and a pair of metal plates opposed to each other in a second direction;
the correction blanking electrode is configured of four metal plates in total mutually opposed in the first direction and the second direction as well as the main blanking electrode;
the measuring/inspecting apparatus further comprising
a first control circuit that controls the first-direction electrode pair of the main blanking electrode and
a second control circuit that controls the second-direction electrode pair of the main blanking electrode
so that deflection of the electron beam can be independently controlled in the X-direction and Y-direction; and
the measuring/inspecting apparatus further comprising
a first control circuit that controls the first-direction electrode pair of the correction blanking electrode and
a second control circuit that controls the second-direction electrode pair of the correction blanking electrode
so that deflection of the electron beam can be independently controlled in the X-direction and Y-direction.

6. The measuring/inspecting apparatus according to claim 1, wherein
a direction of irradiating the sample with the electron beam is a Z-direction, directions of a plane perpendicular to the Z-direction are X-direction and Y-direction;
the main blanking electrode is configured of a pair of metal plates opposed to each other in a particular first direction in the plane of the X-direction and Y-direction;
the correction blanking electrode is configured of four metal plates in total including a pair of metal plates opposed to each other in the first direction as well as the main blanking electrode and a pair of metal plates opposed to each other in the second direction; and
the measuring/inspecting apparatus further comprising
a first control circuit that controls the first-direction electrode pair of the correction blanking electrode and
a second control circuit that controls the second-direction electrode pair of the correction blanking electrode
so that deflection of the electron beam can be independently controlled in the X-direction and Y-direction.

7. The measuring/inspecting apparatus according to claim 1, wherein
a direction of irradiating the sample with the electron beam is a Z-direction, directions of a plane perpendicular to the Z-direction are X-direction and Y-direction;
a raster scanning system is used as a predetermined scanning system to cause the electron beam to carry out scanning in each of X-direction lines and move in the Y-direction;
in the main blanking control and the correction blanking control, the ON/OFF switching of the shutoff is controlled by deflecting the electron beam in the Y-direction; and
the main blanking control causes the shutoff to be in the ON state in the period of the scanning in each of the X-direction lines, causes the shutoff to be in the OFF state when the position of the electron beam is returned between the X-direction lines, and causes the shutoff to be in the OFF state in each non-irradiation region in the X-direction line.

8. The measuring/inspecting apparatus according to claim 1, wherein
a direction of irradiating the sample with the electron beam is a Z-direction, directions of a plane perpendicular to the Z-direction are X-direction and Y-direction;
a vector scanning system is used as a predetermined scanning system to cause the electron beam to carry out scanning in each of arbitrary-direction lines in the plane of the X-direction and Y-direction;
in the main blanking control and the correction blanking control, the ON/OFF switching of the shutoff is controlled by deflecting the electron beam in an arbitrary direction in the plane of the X-direction and Y-direction; and
the main blanking control causes the shutoff to be in the ON state in the period of the scanning in each of the arbitrary-direction lines, causes the shutoff to be in the OFF state when the position of the electron beam is returned between the arbitrary-direction lines, and causes the shutoff to be in the OFF state in each non-irradiation region in the arbitrary-direction line.

9. The measuring/inspecting apparatus according to claim 1, wherein
the sensitivity of the correction blanking electrode is configured to be lower than the sensitivity of the main blanking electrode that is a deflection distance per voltage so that the voltage of the correction blanking control signal is larger than the voltage of the main blanking control signal.

10. The measuring/inspecting apparatus according to claim 9, wherein,
for the sensitivities of the main blanking electrode and the correction blanking electrode, the interelectrode distance of the correction blanking electrode is configured to be wider than the interelectrode distance of the main blanking electrode, and the electrode size of the correction blanking electrode is configured to be smaller than the electrode size of the main blanking electrode.

11. The measuring/inspecting apparatus according to claim 1, wherein
a direction of irradiating the sample with the electron beam is a Z-direction, directions of a plane perpendicular to the Z-direction are X-direction and Y-direction;
the measuring/inspecting apparatus comprising
a mechanism system for placing the sample and subjecting the sample to movement control in the plane of the X-direction and Y-direction; and
a mechanism-system control unit that controls the mechanism system; wherein
the electron beam is caused to carry out scanning in a second direction in the plane of the X-direction and Y-direction while moving the sample in a first direction in the plane of the X-direction and Y-direction by the mechanism system and the mechanism-system control unit.

12. A measuring/inspecting method for carrying out at least one of measuring and inspecting by using a measuring/inspecting apparatus for carrying out at least one of measuring and inspecting of a sample by a scanning electron beam system, the measuring/inspecting apparatus comprising:

an entirety control unit that controls the measuring/inspecting apparatus and articulates a measuring or inspecting process;

an interface unit that provides a user interface for an operation including the measuring or inspecting;

an electrooptical system that includes an optical lens for irradiating the sample with an electron beam;

an electrooptical control unit that controls the electrooptical system;

a deflector for controlling an irradiation position by deflection for scanning control of the electron beam with respect to the sample;

a deflection control circuit that generates a control signal and applies the control signal to the deflector;

a detector that detects a secondary electron or other energy generated from the sample as a result of irradiation with the electron beam;

a signal processing system that processes a signal detected by the detector, generates an image of the measuring or the inspecting, and outputs the image to a user;

a storage unit that stores data information about the measuring or the inspecting;

a main blanking unit for controlling shutoff of the irradiation of the electron beam with respect to the sample;

a correction blanking unit for correction with respect to the main blanking unit; and an aperture for shutting off the electron beam; wherein the main blanking unit has a main blanking electrode and a main blanking control circuit that generates a main blanking control signal and applies the main blanking control signal to the main blanking electrode;

the correction blanking unit has a correction blanking electrode and a correction blanking control circuit that generates a correction blanking control signal and applies the correction blanking control signal to the correction blanking electrode; and the method including a step of, in a period of switching of the state of shutoff of the electron beam from ON to OFF by applying the main blanking control signal from the main blanking control circuit to the main blanking electrode, correcting positional misalignment of the irradiation of the electron beam caused by the main blanking control signal by applying the correction blanking control signal from the correction blanking control circuit to the correction blanking electrode.

13. The measuring/inspecting method according to claim 12, wherein the measuring/inspecting apparatus carries out a processing step of acquiring data of a profile including a first waveform corresponding to ringing in the period of switching of the state of shutoff of the electron beam from ON to OFF by applying the main blanking control signal from the main blanking control circuit to the main blanking electrode by using a predetermined detection pattern while turning off the correction blanking unit in beforehand measurement under a condition set by the user in advance;

a processing step of calculating correction data for generating the correction blanking control signal including a second waveform for cancelling out and more flattening the first waveform of the main blanking control signal by using the data of the profile; and a processing step of mutually associating the condition, the profile, and the correction data, storing the condition, the profile and the correction data in a table, and saving the table in the storage unit.

14. The measuring/inspecting method according to claim 12, wherein the measuring/inspecting apparatus, wherein a direction of irradiating the sample with the electron beam is a Z-direction, directions of a plane perpendicular to the Z-direction are X-direction and Y-direction; and the apparatus carries out:

a processing step of deflecting the electron beam in the plane of the X-direction and Y-direction by applying the control signal from the deflection control circuit to the deflector in accordance with the scanning control of the electron beam with respect to the sample when measuring or inspecting is carried out in a predetermined scanning system based on a condition set by the user;

a processing step of deflecting the electron beam in the plane of the X-direction and Y-direction to shut off the aperture by applying the main blanking control signal from the main blanking control circuit to the main blanking electrode in accordance with main blanking control of the electron beam with respect to the sample synchronized with the scanning control; and a processing step of deflecting the electron beam in the plane of the X-direction and Y-direction by applying the correction blanking control signal from the correction blanking control circuit to the correction blanking electrode in accordance with correction blanking control of the electron beam with respect to the sample synchronized with the main blanking control; and by virtue of the above-described configuration, the positional misalignment of the electron beam caused by the main blanking unit is corrected by the correction blanking unit in real time.

\* \* \* \* \*